(12) United States Patent
Yokota et al.

(10) Patent No.: US 11,644,664 B2
(45) Date of Patent: May 9, 2023

(54) LIGHT DEFLECTOR, OPTICAL SCANNING SYSTEM, IMAGE PROJECTION DEVICE, IMAGE FORMING APPARATUS, AND LIDAR DEVICE

(71) Applicant: Ricoh Company, Ltd., Tokyo (JP)

(72) Inventors: Wataru Yokota, Kanagawa (JP); Goichi Akanuma, Kanagawa (JP); Mizuki Shinkawa, Kanagawa (JP)

(73) Assignee: RICOH COMPANY, LTD., Tokyo (JP)

( * ) Notice: Subject to any disclaimer, the term of this patent is extended or adjusted under 35 U.S.C. 154(b) by 337 days.

(21) Appl. No.: 16/943,510

(22) Filed: Jul. 30, 2020

(65) Prior Publication Data
US 2021/0041687 A1    Feb. 11, 2021

(30) Foreign Application Priority Data
Aug. 7, 2019    (JP) .............. JP2019-145751

(51) Int. Cl.
| | | |
|---|---|---|
| *G02B 26/08* | (2006.01) | |
| *G02B 26/10* | (2006.01) | |
| *G03B 21/00* | (2006.01) | |
| *G01S 7/481* | (2006.01) | |

(52) U.S. Cl.
CPC ....... *G02B 26/0858* (2013.01); *G02B 26/101* (2013.01); *G01S 7/4817* (2013.01); *G03B 21/008* (2013.01)

(58) Field of Classification Search
CPC . G02B 26/0858; G02B 26/101; G01S 7/4817; G01S 17/88; G01S 17/89; G01S 17/93; G01S 17/931; G03B 21/008; B81B 2201/032; B81B 2203/0154; B81B 2203/058; B81B 3/0043; H04N 9/3129
See application file for complete search history.

(56) References Cited

U.S. PATENT DOCUMENTS

| | | | |
|---|---|---|---|
| 6,177,667 B1 | 1/2001 | Fujita et al. | |
| 10,481,390 B2 * | 11/2019 | Maruyama | ............ G02B 26/10 |
| 2010/0033685 A1 | 2/2010 | Seo et al. | |
| 2010/0195180 A1 | 8/2010 | Akanuma et al. | |
| 2010/0309536 A1 | 12/2010 | Akanuma et al. | |
| 2012/0120470 A1 | 5/2012 | Kitazawa et al. | |
| 2015/0062683 A1 | 3/2015 | Akanuma et al. | |
| 2015/0077823 A1 | 3/2015 | Hashiguchi et al. | |
| 2016/0109697 A1 | 4/2016 | Nakagawa et al. | |

(Continued)

FOREIGN PATENT DOCUMENTS

| | | |
|---|---|---|
| JP | 2011-018026 | 1/2011 |
| JP | 2012-008357 | 1/2012 |

(Continued)

*Primary Examiner* — Euncha P Cherry
(74) *Attorney, Agent, or Firm* — Xsensus LLP

(57) ABSTRACT

A light deflector includes a stationary part; a movable unit having a reflecting surface; a connecting part between the movable unit and the stationary part; a drive unit disposed on a first surface of the connecting part, the drive unit configured to deform the connecting part to oscillate the movable unit; and a rib disposed on a second surface of the connecting part, the second surface being an opposite surface of the first surface. The rib includes a portion whose longitudinal direction is orthogonal to a direction at which the connecting part is bent.

18 Claims, 27 Drawing Sheets

(56) References Cited

U.S. PATENT DOCUMENTS

| | | | |
|---|---|---|---|
| 2016/0139404 A1 | 5/2016 | Akanuma | |
| 2018/0282147 A1 | 10/2018 | Shinkawa et al. | |
| 2019/0162949 A1* | 5/2019 | Enomoto | H01L 41/0953 |
| 2019/0391394 A1 | 12/2019 | Shinkawa et al. | |
| 2020/0183151 A1 | 6/2020 | Nanjyo et al. | |

FOREIGN PATENT DOCUMENTS

| | | |
|---|---|---|
| JP | 2012-027425 | 2/2012 |
| JP | 2014-092630 | 5/2014 |
| JP | 2014-102354 | 6/2014 |
| JP | 2014-235298 | 12/2014 |
| JP | 2016-027425 | 2/2016 |
| JP | 2016-170376 | 9/2016 |

\* cited by examiner

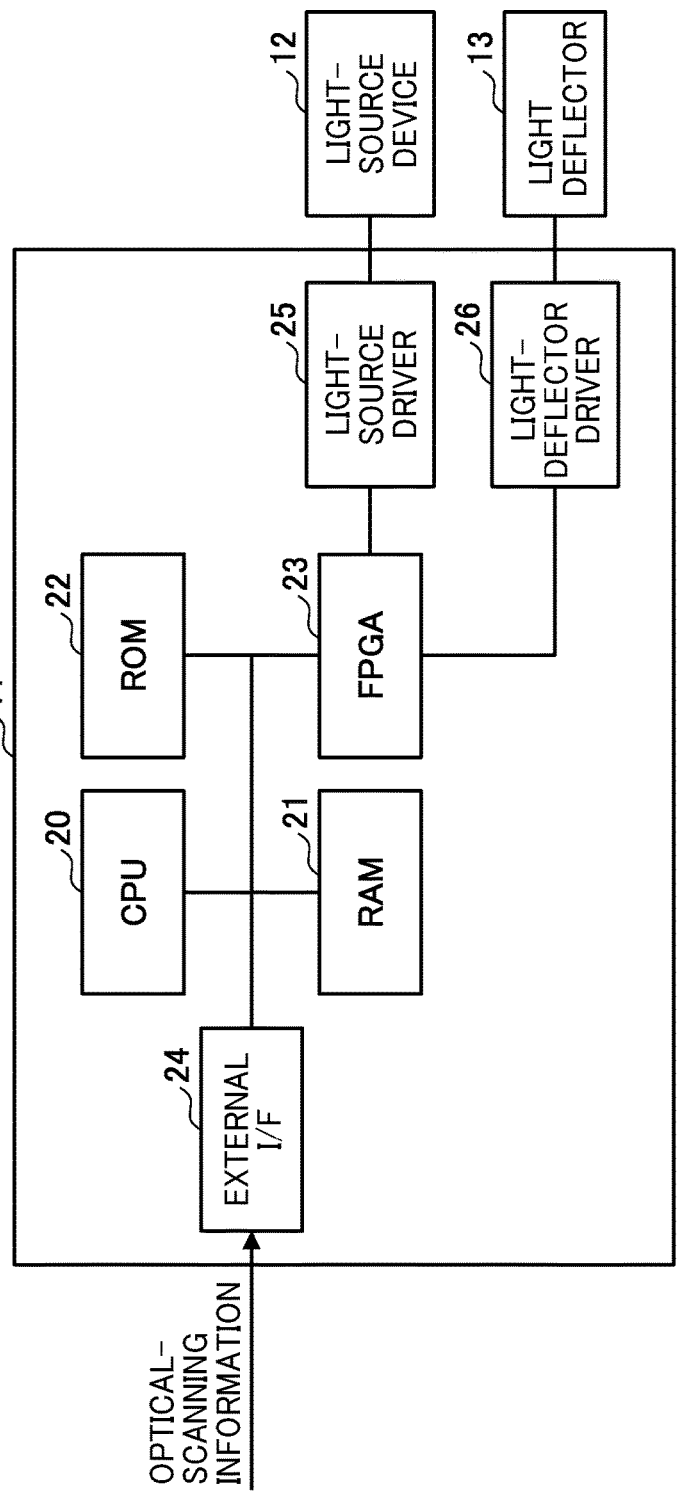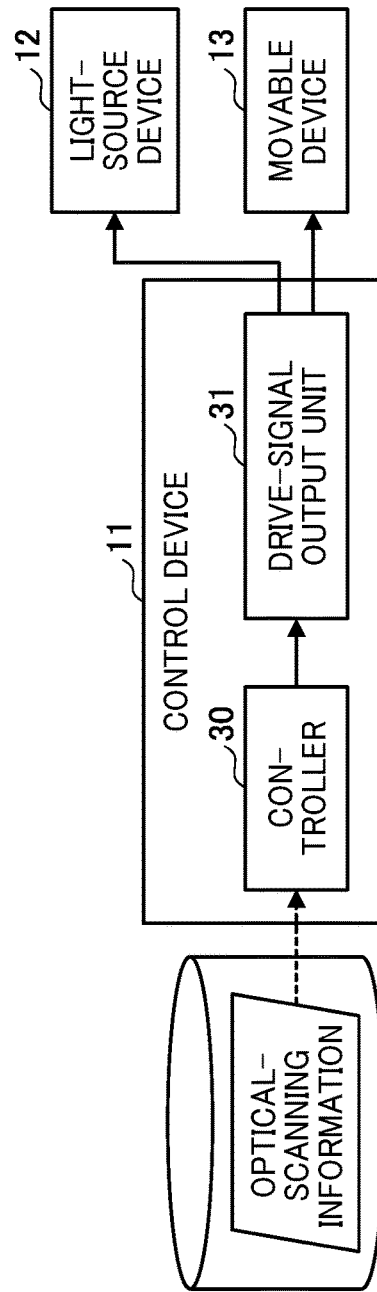

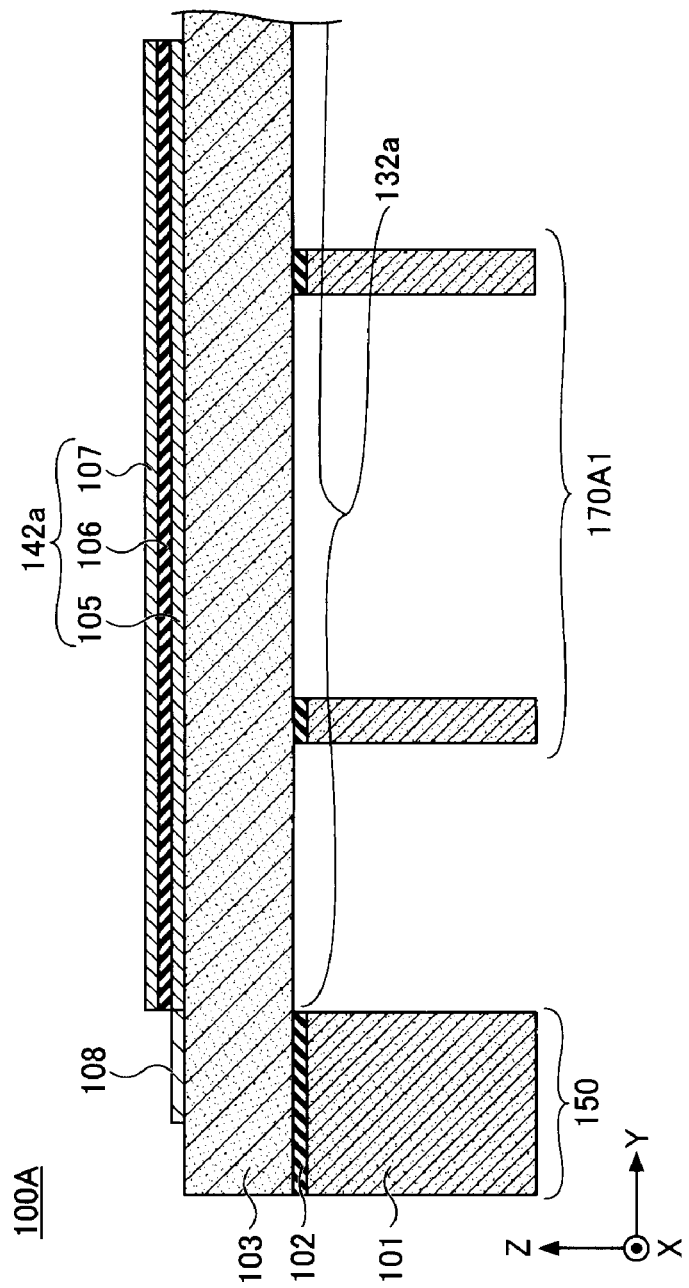

LIGHT DEFLECTOR, OPTICAL SCANNING SYSTEM, IMAGE PROJECTION DEVICE, IMAGE FORMING APPARATUS, AND LIDAR DEVICE

CROSS-REFERENCE TO RELATED APPLICATIONS

This patent application is based on and claims priority pursuant to 35 U.S.C. § 119(a) to Japanese Patent Application No. 2019-145751, filed on Aug. 7, 2019, in the Japan Patent Office, the entire disclosure of which is hereby incorporated by reference herein.

BACKGROUND

Technical Field

Embodiments of the present disclosure relate to a light deflector, an optical scanning system, an image projection device, an image forming apparatus, and a LiDAR (Light Detection and Ranging) device.

Related Art

In recent years, with the development of micromachining technology applying semiconductor manufacturing technology, development of micro electro mechanical systems (MEMS) devices as light deflectors manufactured by micromachining silicon or glass is advancing.

Such light deflectors, for example, include a mirror having a reflecting surface that reflects light, an elastic connecting part that serves as a rotation axis for torsionally oscillating the mirror, and a piezoelectric drive circuit to generate drive force to cause the mirror to twist and oscillate around the rotation axis.

SUMMARY

In one aspect of this disclosure, there is described a light deflector including: a stationary part; a movable unit having a reflecting surface; a connecting part between the movable unit and the stationary part; a drive unit disposed on a first surface of the connecting part; and a rib disposed on a second surface of the connecting part, the second surface being an opposite surface of the first surface. The drive unit is configured to deform the connecting part to oscillate the movable unit. The rib includes a portion whose longitudinal direction is orthogonal to a direction at which the connecting part is bent.

In another aspect of this disclosure, there is disclosed a light deflector including a first stationary part; a movable unit having a reflecting surface; a first connecting part between the movable unit and the stationary part; a first drive unit disposed on a first surface of the first connecting part, the first drive unit configured to deform the first connecting part to oscillate the movable unit about a first axis; and a rib disposed on a second surface of the first connecting part. The second surface is an opposite surface of the first surface, and the rib includes a portion whose longitudinal direction is orthogonal to a direction at which the first connecting part is bent. The first axis is orthogonal to the direction at which the first connecting part is bent. The light deflector further includes a second stationary part disposed at an outer peripheral area of the first stationary part; a pair of second connecting parts each connected to the first stationary part and the second stationary part; and second drive units each configured to deform a corresponding one of the second connecting parts to oscillate the movable unit about a second axis orthogonal to the first axis.

In even another aspect of this disclosure, there is disclosed an optical scanning system including the light deflector.

In still another aspect of this disclosure, there is disclosed an image projection device including the light deflector.

Further described is an image forming apparatus including the optical scanning system.

Further described is a light detection and ranging device including the light deflector.

BRIEF DESCRIPTION OF THE SEVERAL VIEWS OF THE DRAWINGS

The aforementioned and other aspects, features, and advantages of the present disclosure would be better understood by reference to the following detailed description when considered in connection with the accompanying drawings, wherein:

FIG. 2 is a hardware block diagram of the optical scanning system according to an embodiment of the present disclosure;

FIG. 3 is a functional block diagram of a control device of the optical scanning system, according to an embodiment of the present disclosure;

FIG. 19 is a cross-sectional view of a part of a light deflector according to a second embodiment of the present disclosure;

Figure 1:
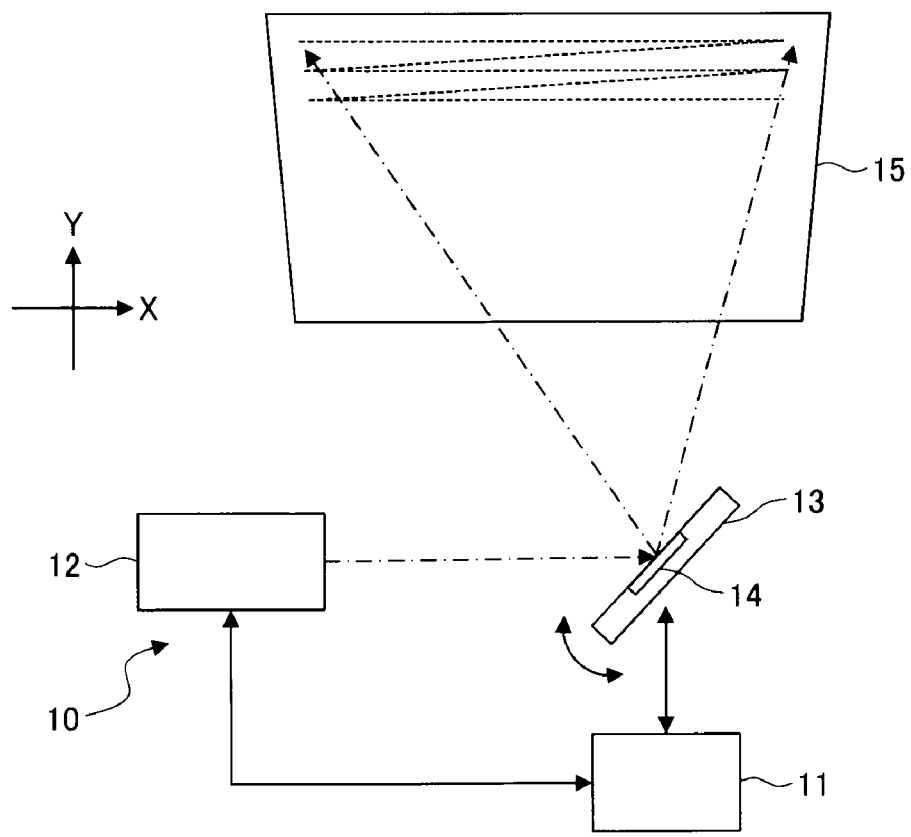
FIG. 1 is a schematic view of an example of an optical scanning system.

The accompanying drawings are intended to depict embodiments of the present disclosure and should not be interpreted to limit the scope thereof. The accompanying drawings are not to be considered as drawn to scale unless explicitly noted.

DETAILED DESCRIPTION

In describing embodiments illustrated in the drawings, specific terminology is employed for the sake of clarity. However, the disclosure of this patent specification is not intended to be limited to the specific terminology so selected and it is to be understood that each specific element includes all technical equivalents that operate in a similar manner and achieve similar results.

Although the embodiments are described with technical limitations with reference to the attached drawings, such description is not intended to limit the scope of the disclosure and all of the components or elements described in the embodiments of this disclosure are not necessarily indispensable.

Referring now to the drawings, embodiments of the present disclosure are described below. In the drawings for explaining the following embodiments, the same reference codes are allocated to elements (members or components) having the same function or shape and redundant descriptions thereof are omitted below.

Embodiments of the present disclosure achieve an increase in the angle of oscillation of a mirror per unit voltage.

Embodiments of the present disclosure are described below in detail.

With initially reference to FIGS. 1 to 4, an optical scanning system 10 to which a control device 11 according to an embodiment of the present disclosure is applied is described below in detail.

FIG. 1 is an illustration of an optical scanning system according to an embodiment of the present disclosure.

As illustrated in FIG. 1, the optical scanning system 10 deflects light emitted from a light-source device 12 in accordance with the control of the control device 11, using a reflecting surface 14 included in a light deflector 13, so as to optically scan a surface 15 to be scanned (target surface).

The optical scanning system 10 includes the control device 11, the light-source device 12, and the light deflector 13 including the reflecting surface 14.

The control device 11 is, for example, an electronic circuit unit including, for example, a central processing unit (CPU) and a field-programmable gate array (FPGA). The light deflector 13 is, for example, a micro electro mechanical systems (MEMS) device that includes a movable reflecting surface 14. The light-source device 12 is, for example, a laser device that emits a laser beam. The target surface 15 is, for example, a screen.

The control device 11 generates a control instruction of the light-source device 12 and the light deflector 13 based on optical scanning information obtained from an external device, and outputs a drive signal to the light-source device 12 and the light deflector 13 in accordance with the control instruction.

The light-source device 12 emits light in accordance with the input drive signal.

The light deflector 13 moves the reflecting surface 14 in at least one of a uniaxial direction and a biaxial direction, in accordance with the received (input) drive signal.

This configuration, for example, biaxially moves the reflecting surface 14 of light deflector 13 in a reciprocating manner and deflects the light emitted from the light-source device 12 to be incident on the reflecting surface 14 to perform optical scanning, under the control of the control device 11, which is based on image data that is an example of the optical scanning information. Thus, an image is projected onto the target surface 15 as desired.

The details of the light deflector of the present embodiment and the details of the control by the control device are described later.

Referring now to FIG. 2, a hardware configuration of the optical scanning system 10 is described below.

FIG. 2 is a hardware block diagram of the optical scanning system 10 according to an embodiment of the present disclosure.

As illustrated in FIG. 2, the optical scanning system 10 includes the control device 11, the light-source device 12, and the light deflector 13, which are electrically connected to each other. The control device 11 includes a CPU 20, a random access memory (RAM) 21, a read only memory (ROM) 22, a FPGA 23, an external interface (I/F) 24, a light-source driver 25, and a light-deflector driver 26.

The CPU 20 is an arithmetic device that loads into the RANI 21 a program or data from a storage device such as the ROM 22 and executes processing to provide the controls or functions of the entirety of the control device 11.

The RAM 21 is a volatile storage device that temporarily stores a program or data.

The ROM 22 is a non-volatile storage device that stores a program or data even after the power is turned off, and stores a program or data for processing that is executed by the CPU 20 to control each function of the optical scanning system 10.

The FPGA 23 is a circuit that outputs control signals to the light-source driver 25 and the light-deflector driver 126, respectively, according to a process performed by the CPU 20.

The external I/F 24 is an interface with an external device or a network. The external device may be, for example, a host device such as a personal computer (PC); or a storage device, such as a universal serial bus (USB) memory, a secure digital (SD) card, a compact disk (CD), a digital versatile disk (DVD), a hard disk drive (HDD), or a solid state drive (SSD). The network may be, for example, a controller area network (CAN) of an automobile, a local area network (LAN), or the Internet. The external I/F 24 may have any configuration that achieves connection to an external device or communication with an external device. The external I/F 24 may be prepared for each external device.

The light-source driver 25 is an electric circuit that outputs a drive signal such as a drive voltage to the light-source device 12 in accordance with the control signal output from the FPGA 23.

The light-deflector driver 26 is an electric circuit that outputs a drive signal such as a drive voltage to the light deflector 13 in accordance with the control signal output from the FPGA 23.

The CPU 20 of the control device 11 acquires optical-scanning information from an external device or a network through the external I/F 24. Note that any configuration may be used as long as the CPU 20 can acquire the optical-scanning information, and the optical-scanning information may be stored in the ROM 22 or in the FPGA 23 in the control device 11. Alternatively, a storage device such as an SSD may be additionally provided in the control device 11 and the optical-scanning information may be stored in the storage device.

In this case, the optical-scanning information is information indicating the way of optical scanning to be performed on the target surface 15. The optical-scanning information is, for example, image data when an image is displayed by optical scanning. For another example, the optical-scanning information is writing data indicating the order and portion of writing when optical writing is performed by optical scanning. For still another example, the optical-scanning information is irradiation data indicating the timing and range of irradiation of light for object recognition in a case where an object is to be recognized by optical scanning.

The control device 11 according to the present embodiment provide the functional configuration described below by using instructions from the CPU 20 and the hardware configuration illustrated in FIG. 2. The following describes a functional configuration of the control device 11 of the optical scanning system 10, with reference to FIG. 3. FIG. 3 is a functional block diagram of an example of the control device 11 of the optical scanning system 10, according to an embodiment of the present disclosure.

As illustrated in FIG. 3, the control device 11 has the functions of a controller 30 and a driving-signal output unit 31.

The controller 30 is implemented by, for example, the CPU 20 and the FPGA 23. The controller 30 acquires optical-scanning information from an external device, converts the optical-scanning information into a control signal, and outputs the control signal to the drive-signal output unit 31. The controller 30, for example, acquires image data as the optical-scanning information from, for example, an external device, generates a control signal based on the image data through predetermined processing, and outputs the control signal to the drive-signal output unit 31.

The drive-signal output unit 31 is implemented by, for example, the light-source driver 25 or the light-deflector driver 26. The drive-signal output unit 31 outputs a drive signal to the light-source device 12 or the light deflector 13 in accordance with the received control signal. The drive-signal output unit 31 may be provided for each destination to which a driving signal is output.

Figure 4:
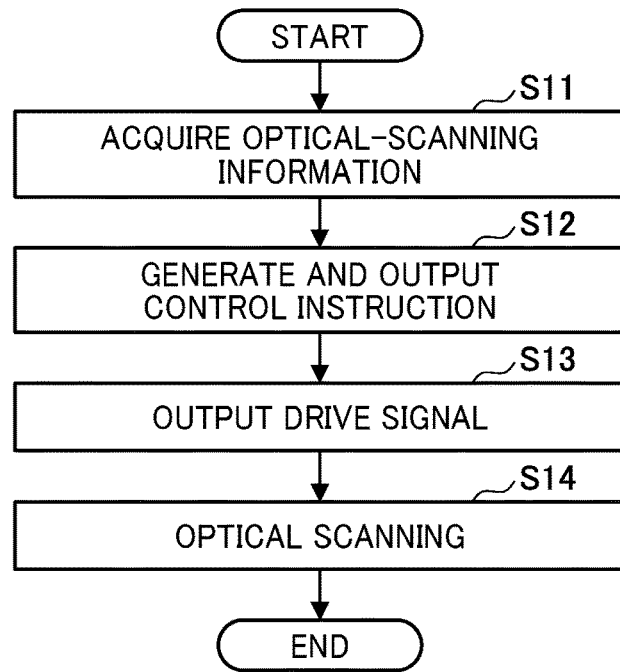
FIG. 4 is a flowchart of processing relating to the optical scanning system, according to an embodiment of the present disclosure.

The drive signal is a signal for controlling the drive of the light-source device 12 or the light deflector 13. The drive signal to be output to the light-source device 12 is, for example, a drive voltage used to control the light-emission timing and emission intensity of the light source. Further, the drive signal to be output to the light deflector 13 is, for example, a drive voltage used to control the timing and range of motion where the reflecting surface 14 of the light deflector 13 is moved. In some examples, the control device 11 may acquire the light-emission timing of a light source of the light-source device 12 or the light-receiving timing from an external device, such as the light-source device 12 or a light receiver, and synchronize these timings with the drive of the light deflector 13. Next, a process of optically scanning the target surface 15 by using the optical scanning system 10 is described referring to FIG. 4. FIG. 4 is a flowchart of processing relating to the optical scanning system 10, according to an embodiment of the present disclosure.

In step S11, the controller 30 acquires optical-scanning information from, for example, an external device.

In step S12, the controller 30 generates control signals from the acquired optical-scanning information, and outputs the control signals to the drive-signal output unit 31.

In step S13, the drive-signal output unit 31 outputs drive signals to the light-source device 12 and the light deflector 13, respectively, in accordance with the received control signals.

In step S14, the light-source device 12 emits light in accordance with the drive signal output from the drive-signal output unit 31. In addition, the light deflector 13 operates to move the reflecting surface 14 in accordance with the drive signal output from the drive-signal output unit 31. Driving the light-source device 12 and the light deflector 13 causes light to be deflected in a given direction, and optical scanning is performed.

In the above-described optical scanning system 10, a single controller 11 has a device and a function for controlling the light-source device 12 and the light deflector 13. However, a control device for the light-source device and a control device for the movable device may be separate elements.

In the above-described optical scanning system 10, a single control device 11 has the function of the controller 30 and the function of the drive-signal output unit 31 for the light-source device 12 and the light deflector 13. These functions may be implemented by separate elements. For example, a drive-signal output device including a drive-signal output unit 31 may be provided in addition to the control device 11 including the controller 30. In the above-described optical scanning system 10, the light deflector 13 having the reflecting surface 14 and the control device 11 may constitute a light deflection system for performing optical deflection. Next, an image projecting device to which the control device 11 according to an embodiment of the present disclosure is applied is described in detail with reference to FIGS. 5 and 6.

Figure 5:
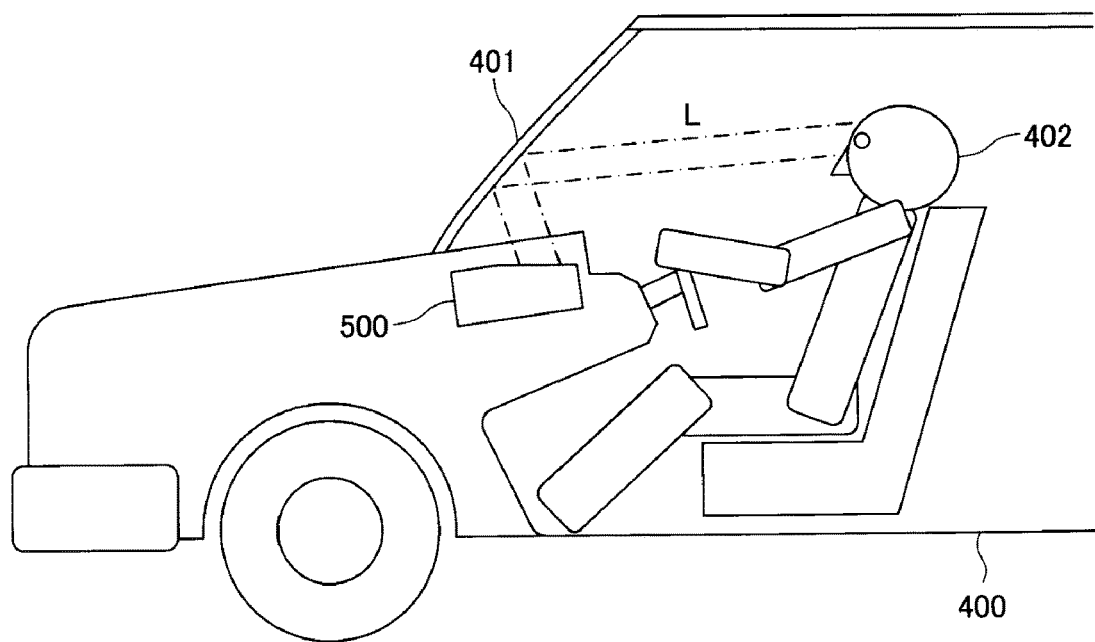
FIG. 5 is a schematic view of a vehicle equipped with a head-up display device (HUD) according to an embodiment of the present disclosure.
Figure 6:
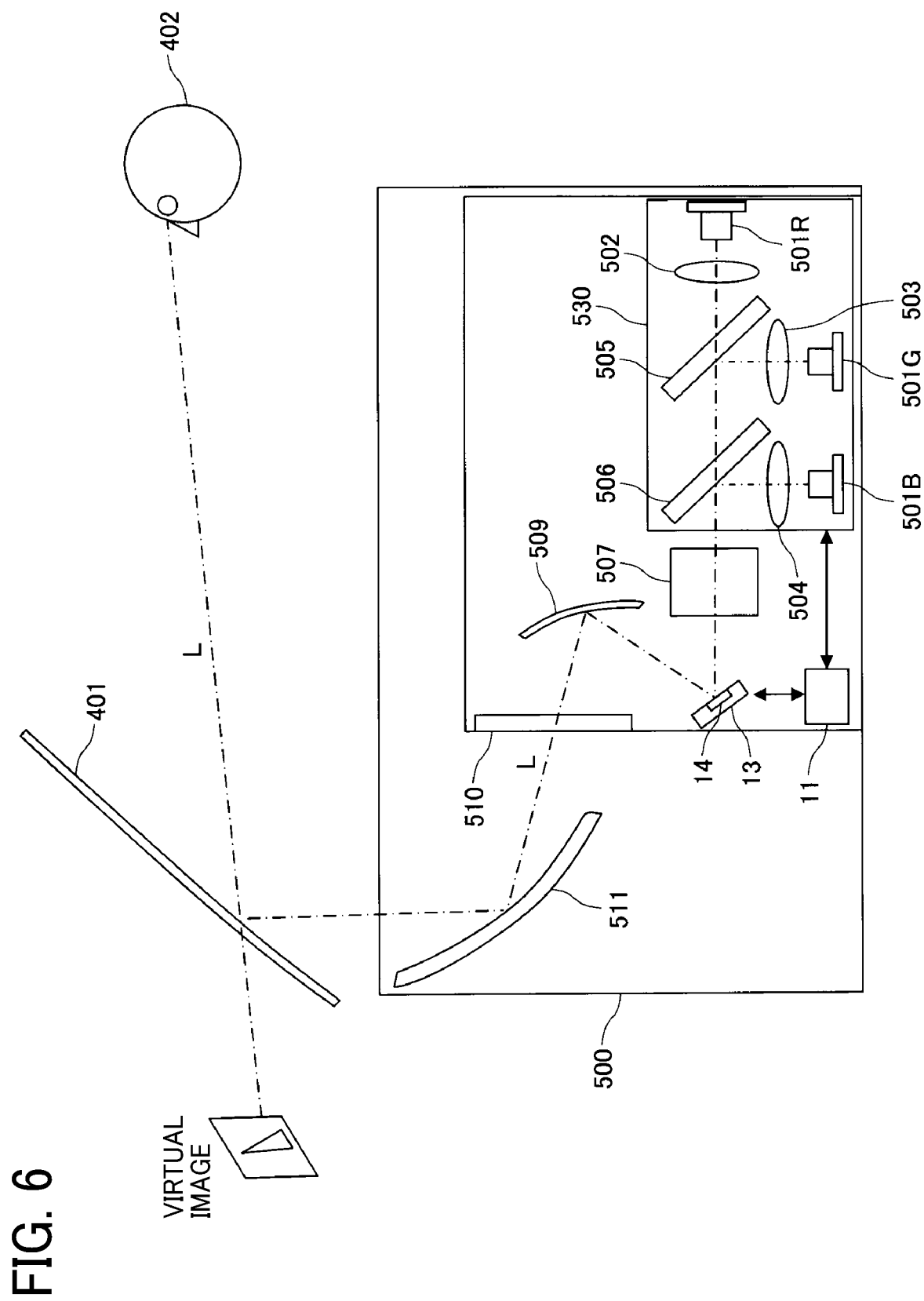
FIG. 6 is a schematic view of a HUD according to an embodiment of the present disclosure.

FIG. 5 is a schematic view of a vehicle 400 equipped with a HUD 500 as an example of an image projection device according to an embodiment of the present disclosure. FIG. 6 is a schematic view of the HUD 500 according to an embodiment of the present disclosure.

The image projection device projects an image by optical scanning and is an example of a HUD.

As illustrated in FIG. 5, for example, the HUD 500 is disposed, for example, near a windshield 401 of the vehicle 400. Projection light L that is emitted from the HUD 500 is reflected by the windshield 401 and directed to a viewer (a driver 402) as a user.

This configuration enables the driver 402 to visually recognize an image as a virtual image projected by the HUD 500. Alternatively, a combiner may be disposed on the inner wall surface of the windshield 401 so that the user can visually recognize a virtual image formed by the projection light that is reflected by the combiner.

As illustrated in FIG. 6, the HUD 500 emits laser beams through red, green, and blue laser beam sources 501R, 501G, and 501B, respectively. The emitted laser beams pass through an optical system for receiving light, and then are deflected by the light deflector 13 including the reflecting surface 14. The optical system includes collimator lenses 502, 503, and 504 provided for the laser-beam sources 501R, 501G, and 501B, respectively, two dichroic mirrors 505 and 506, and a light-intensity adjuster 507.

The deflected laser beams pass through a projection optical system and are projected onto a screen. The projection optical system includes a free-form surface mirror 509, an intermediate screen 510, and a projection mirror 511.

In the HUD 500, the laser-beam sources 501R, 501G, and 501B, the collimator lenses 502, 503, and 504, and the dichroic mirrors 505 and 506 are combined as a single integrated unit, that is, a light-source unit 530 in an optical housing.

The HUD 500 projects an intermediate image displayed on the intermediate screen 510 onto the windshield 401 of the vehicle 400 to allow the driver 402 to visually recognize the intermediate image as a virtual image.

The laser beams of RGB colors emitted from the laser-beam sources 501R, 501G, and 501B are collimated by the collimator lenses 502, 503, and 504 into approximately parallel beams, and are combined by the two dichroic mirrors 505 and 506.

The light intensity of the combined laser beams is adjusted by the light-intensity adjuster 507, and then two-dimensional scanning is performed by the light deflector 13 provided with the reflecting surface 14. The projection light L used for two-dimensional scanning by the light deflector 13 is reflected by the free-form surface mirror 509 so as to correct the distortion, and then is collected and focused onto the intermediate screen 510 to display an intermediate image on the intermediate screen 510.

The intermediate screen 510 includes a microlens array in which a plurality of microlenses are two-dimensionally arranged, and enlarges the projection light L incident on the intermediate screen 510 in units of microlens. The light deflector 13 moves the reflecting surface 14 biaxially in a reciprocating manner to perform two-dimensional scanning with the projection light L incident on the reflecting surface 14. The driving of the light deflector 13 is controlled in synchronization with the timing of light emission of the laser beam sources 501R, 501G, and 501B.

In the above description, the HUD 500 is described as an example of the image projection device. However, no limitation is indicated thereby, and the image projection device may be any apparatus that performs optical scanning, using light deflector 13 provided with the reflecting surface 14, to project an image.

For example, the present disclosure is also applicable to a projector that is placed on a desk or the like and projects an image on a display screen, a head-mounted display device that is incorporated in a wearable member on the head of the observer, for example, and that projects an image on a reflective-and-transmissive screen of the wearable member or on an eyeball as a screen, and the like.

The image projection device may be incorporated in, not only a vehicle or the wearable member, but also, for example, a mobile object such as an aircraft, a ship, or a moving robot, and an immobile object such as an operation robot that operates a driving target such as a manipulator without moving from the installed location.

Next, an optical writing device to which the control device 11 according to an embodiment of the present disclosure is applied is described in detail with reference to FIGS. 7 and 8.

Figure 7:
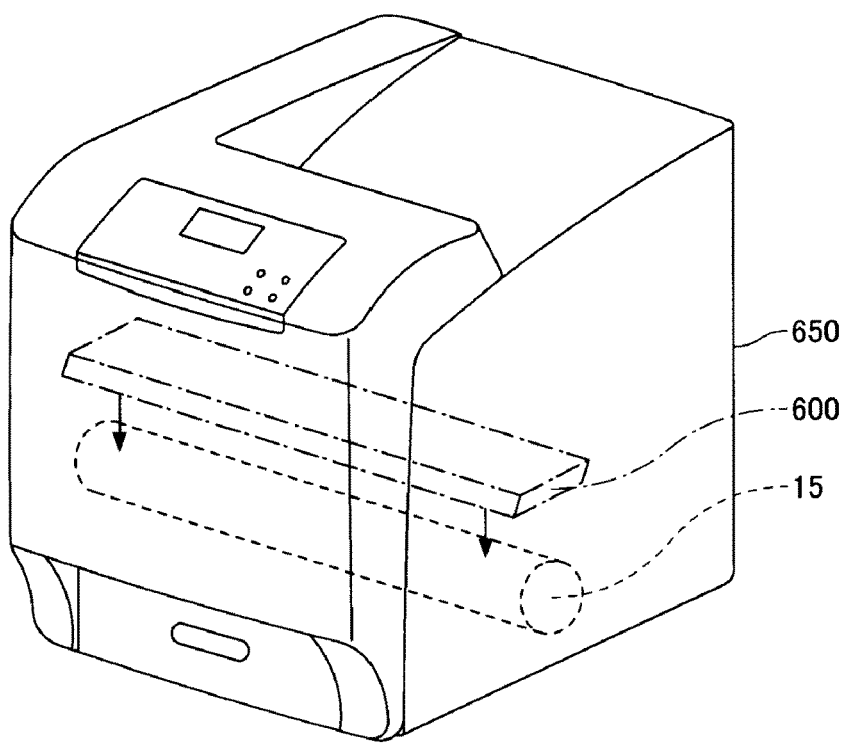
FIG. 7 is an illustration of an image forming apparatus incorporating an optical wiring device, according to an embodiment of the present disclosure.

FIG. 7 is an illustration of an image forming apparatus incorporating an optical writing device 600, according to an embodiment of the present disclosure. FIG. 8 is a schematic view of the optical writing device according to an embodiment of the present disclosure.

As illustrated in FIG. 7, the optical writing device 600 is used as a component of an image forming apparatus typified by, for example, a laser printer 650 having printer functions using laser beams. In the image forming apparatus, the optical writing device 600 performs optical scanning on a photoconductor drum, which is the target surface 115, by using one or more laser beams, thereby performing optical writing on the photoconductor drum.

Figure 8:
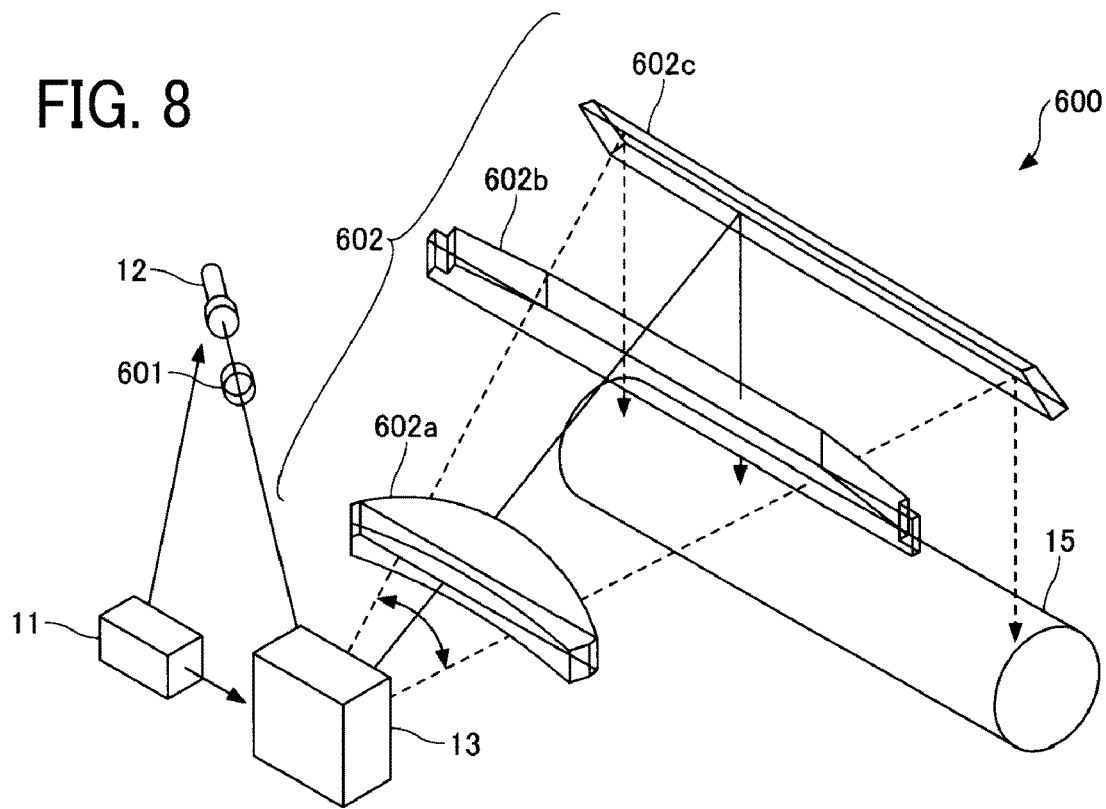
FIG. 8 is a schematic view of an example of the optical writing device.

As illustrated in FIG. 8, in the optical writing device 600, the laser beam from the light-source device 12 such as a laser element passes through an image forming optical system 601 such as a collimator lens and is then deflected uniaxially or biaxially by the light deflector 13 including the reflecting surface 14.

The laser beam deflected by the light deflector 13 passes through a scanning optical system 602 constituted by a first lens 602a, a second lens 602b, and a reflecting mirror unit 602c, and is emitted onto the target surface 15 (e.g., a photoconductor drum or photosensitive paper), thus performing optical writing. The scanning optical system 602 forms a laser beam in the form of a spot on the target surface 15.

The light deflector 13 that includes the light-source device 12 and the reflecting surface 14 are driven in accordance with the control of the control device 11.

As described above, the optical writing device 600 is used as a component of an image forming apparatus having a printer function using laser beams.

Moreover, by employing another scanning optical system to perform scanning in a biaxial manner in addition to the uniaxial manner, the optical writing device 600 can also be used as a component of an image forming apparatus such as a laser label apparatus that deflects laser beams to perform optical scanning on thermal media and print letters by heating.

The light deflector 13 including the reflecting surface 14 to be applied to the optical writing device is advantageous in saving power of the optical writing device because power consumption for driving the light deflector 13 is less than that for driving a rotational polygon mirror or the like.

The light deflector 13 makes a smaller wind noise when the mirror substrate oscillates than rotational polygon mirror, and thus is advantageous in achieving low noise of the optical writing device. The optical writing device requires much smaller installation space than a rotational polygon mirror, and the amount of heat generated by the light deflector 13 is small. For this reason, downsizing is easily achieved, and thus the optical writing device is advantageous in downsizing the image forming apparatus.

Figure 9:
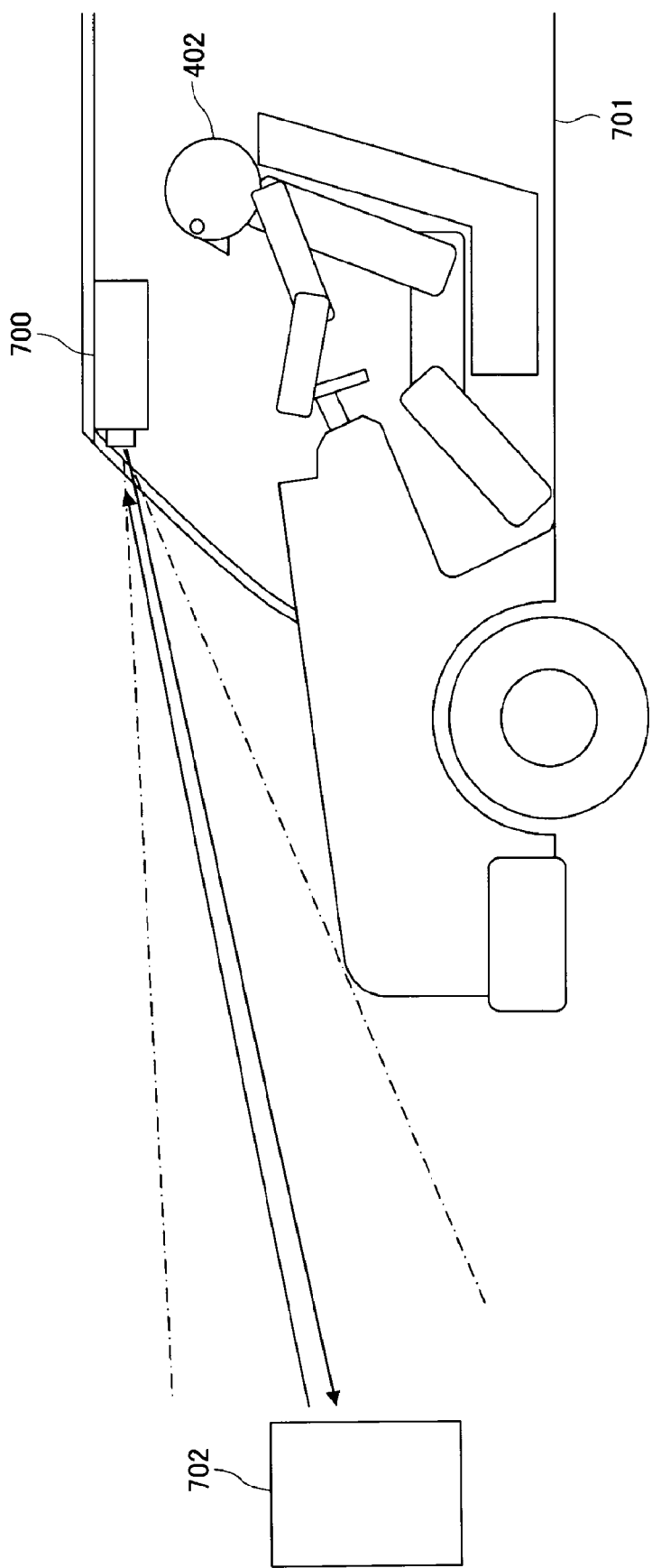
FIG. 9 is a schematic view of a vehicle equipped with a LiDAR device as an example of an object recognition device.
Figure 10:
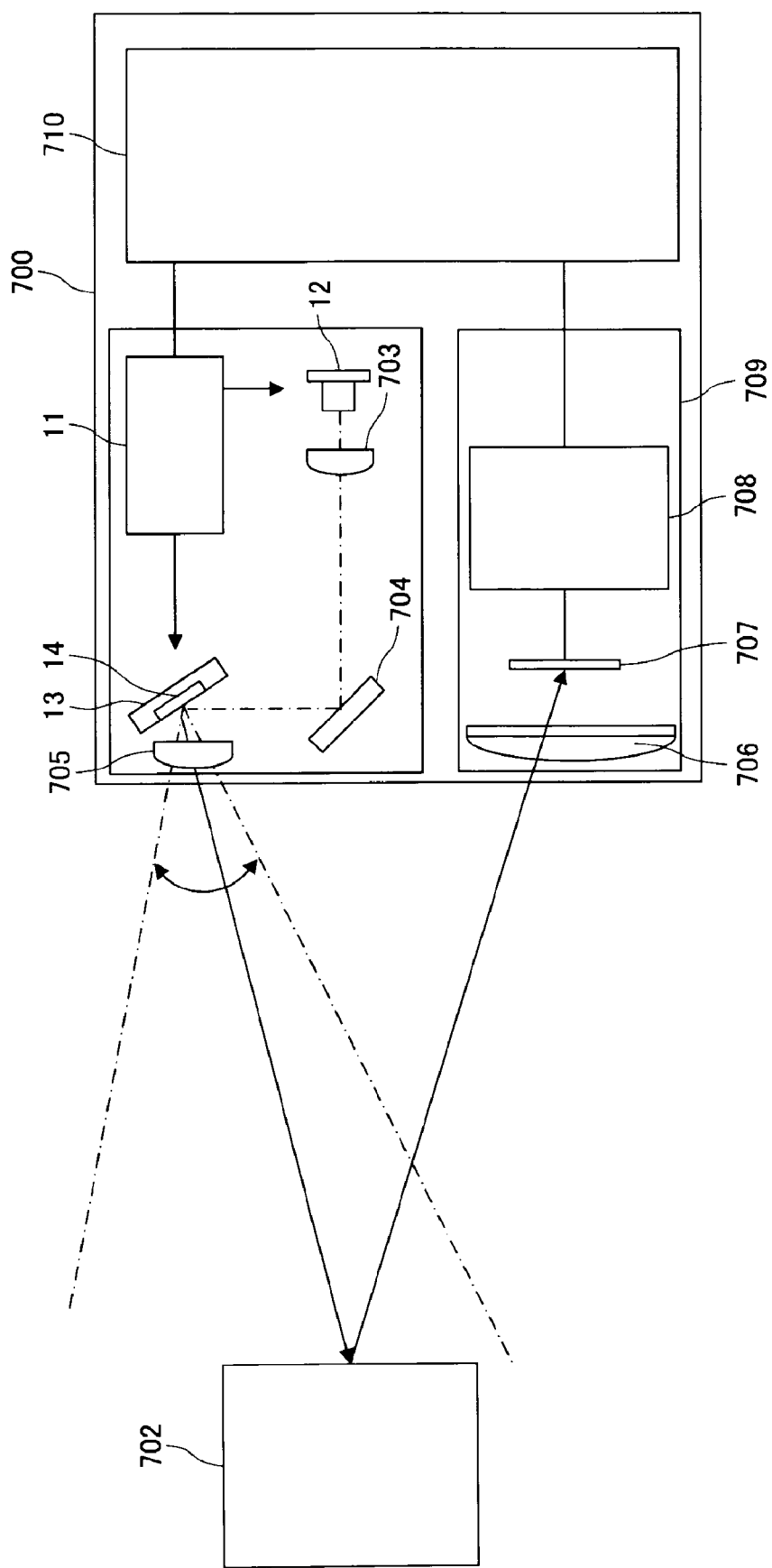
FIG. 10 is a schematic view of the LiDAR device according to an embodiment of the present disclosure.

Next, an object recognition device to which the control device according to an embodiment of the present disclosure is applied is described in detail with reference to FIGS. 9 and 10. FIG. 9 is a schematic view of a vehicle equipped with a LiDAR device as an example of an object recognition device. FIG. 10 is a schematic view of the LiDAR device according to an embodiment of the present disclosure.

The object recognition device is an apparatus that recognizes an object in a target direction and is, for example, a LiDAR device.

As illustrated in FIG. 9, for example, a LiDAR device 700 is mounted on a vehicle 701 to perform optical scanning in a target direction and receive the light reflected from an object 702 that exists in the target direction, thus recognizing the object 702.

As illustrated in FIG. 10, the laser beams emitted from a light-source device 12 pass through an incident optical system, and then are caused to perform scanning uniaxially or biaxially using the light deflector 13 including the reflecting surface 14. The incidence optical system includes a collimator lens 703 that serves as an optical system that collimates divergent beams into approximately parallel beams, and a planar mirror 704.

The parallel beams are emitted to the object 702 ahead of the device, as passing through, for example, a projection lens 705 that serves as a projection optical system. The driving of the light-source device 12 and the light deflector 13 is controlled by the control device 11. The light that is reflected by the object 702 is detected by a photosensor 709.

More specifically, the reflected light passes through, for example, a condenser lens 706 that serves as an incident-light receiving optical system, and is received by an image sensor 707. Then, the image sensor 707 outputs a detected signal to a signal processing circuit 708. The signal processing circuit 708 performs predetermined processing on the received detected signal, such as binarization or noise processing, and outputs the result to a distance measuring circuit 710.

The distance measuring circuit 710 determines whether the object 702 is present based on the time difference between the timing at which the light-source device 12 emits laser beams and the timing at which the photosensor 709 receives the laser beams or the phase difference per pixel of the image sensor 707 that have received the laser beams. Moreover, the distance measuring circuit 710 calculates distance information indicating the distance from the object 702.

The light deflector 13 including the reflecting surface 14 is less likely broken and is compact compared with a polygon mirror, and thus, a highly durable and compact LiDAR device can be provided.

Such a LiDAR device is attached to, for example, a vehicle, an aircraft, a ship, a robot, or the like, and can perform optical scanning within a predetermined range to determine whether an obstacle is present or to recognize the distance to the obstacle.

In the present embodiment, the LiDAR device 700 is described as an example of the object recognition device. However, no limitation is intended thereby. The object recognition device may be any apparatus that performs optical scanning by controlling the light deflector 13 provided with the reflecting surface 14, using the control device 11, and that receives the receives the reflected laser beam using a photodetector to recognize the object 702.

For example, the present disclosure is also applicable to a biometric authentication apparatus, a security sensor, or a component of a three-dimensional scanner, for example. The biometric authentication apparatus performs optical scanning on a hand or face to obtain distance information, calculates object information such as the shape of the object based on the distance information, and refers to records to recognize the object. The security sensor performs optical scanning in a target range to recognize an incoming object. The three-dimensional scanner performs optical scanning to obtain distance information, calculates object information such as the shape of the object based on the distance information to recognize the object, and outputs the object information in the form of three-dimensional data.

Next, the packaging of the light deflector 13 that is controlled by the control device 11 according to an embodiment of the present disclosure is described with reference to FIG. 11.

Figure 11:
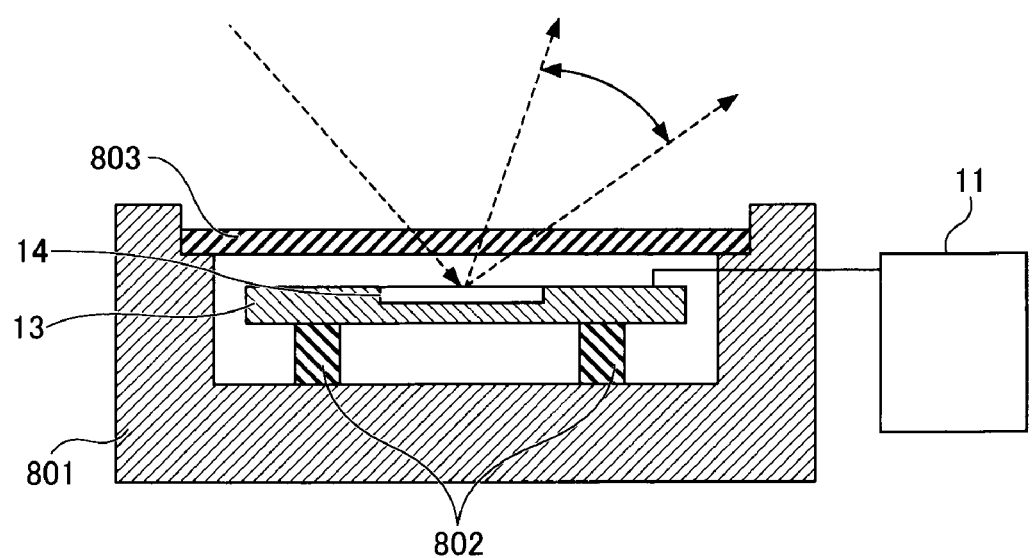
FIG. 11 is a schematic diagram of a packaged light deflector according to a first embodiment of the present disclosure.

FIG. 11 is a schematic diagram of the light deflector 13 packaged according to an embodiment of the present disclosure.

As illustrated in FIG. 11, the light deflector 13 is mounted on a mounting member 802 inside a package member 801. The package member 801 is partly covered with and sealed by a transmissive member 803 so that the light deflector 13 is packaged.

The package contains inert gas such as nitrogen and is sealed. This configuration can prevent the deterioration of the light deflector 13 due to oxidation and increase the durability against changes in environment such as temperature.

The following describes the details of the light deflector that is used for the above-described optical deflection system, optical scanning system, image projection device, optical writing device, and object recognition device, and the details of the control by the control device according to an embodiment. In other words, a light deflector to be described in the following embodiments is available in the above-described optical deflection system, optical scanning system, image projection device, optical writing device, and object recognition device. Like reference signs are applied to identical or corresponding components throughout the drawings and redundant description thereof may be omitted.

All of the terms of rotation, oscillation, and movement in the embodiments refer to operating the mirror unit 110 and are all synonymous. In the drawings, the X-direction is parallel to an axis A, and the Y-axis is parallel to an axis B. The Z-direction is perpendicular to the XY plane. The Z-direction is an example of a direction in which layers are stacked, that is, a stacking direction.

In the present disclosure, the terms "vertical", "parallel", and "orthogonal" refer to substantially vertical, parallel, and orthogonal within the range that does not affect the operation. In particular, the terms "vertical" and "orthogonal" each forms an angle of 90±10° with a line, and the term "parallel" forms an angle of 0±10° with a line.

Figure 12:
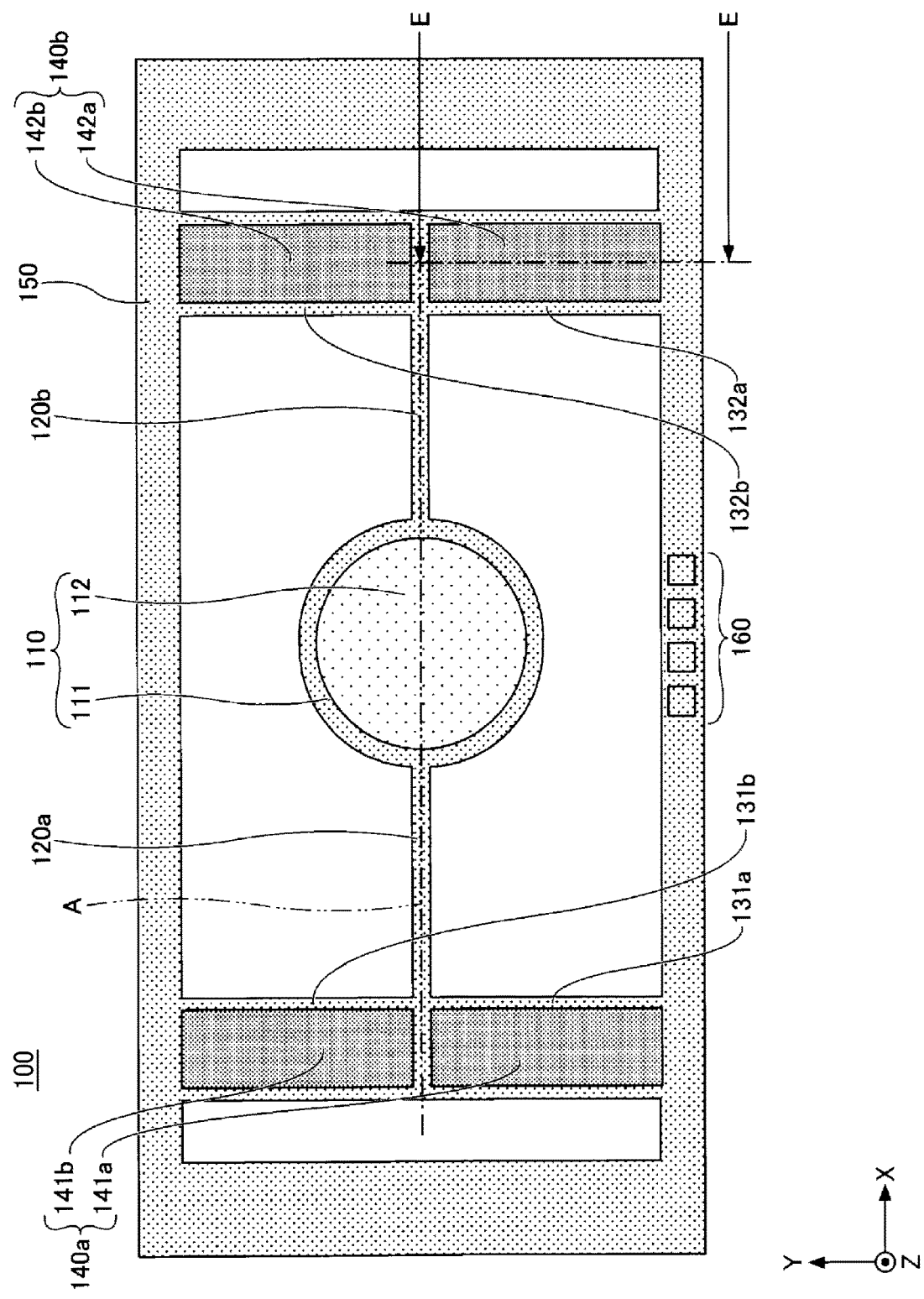
FIG. 12 is a plan view of the light deflector according to a first embodiment of the present disclosure.
Figure 13:
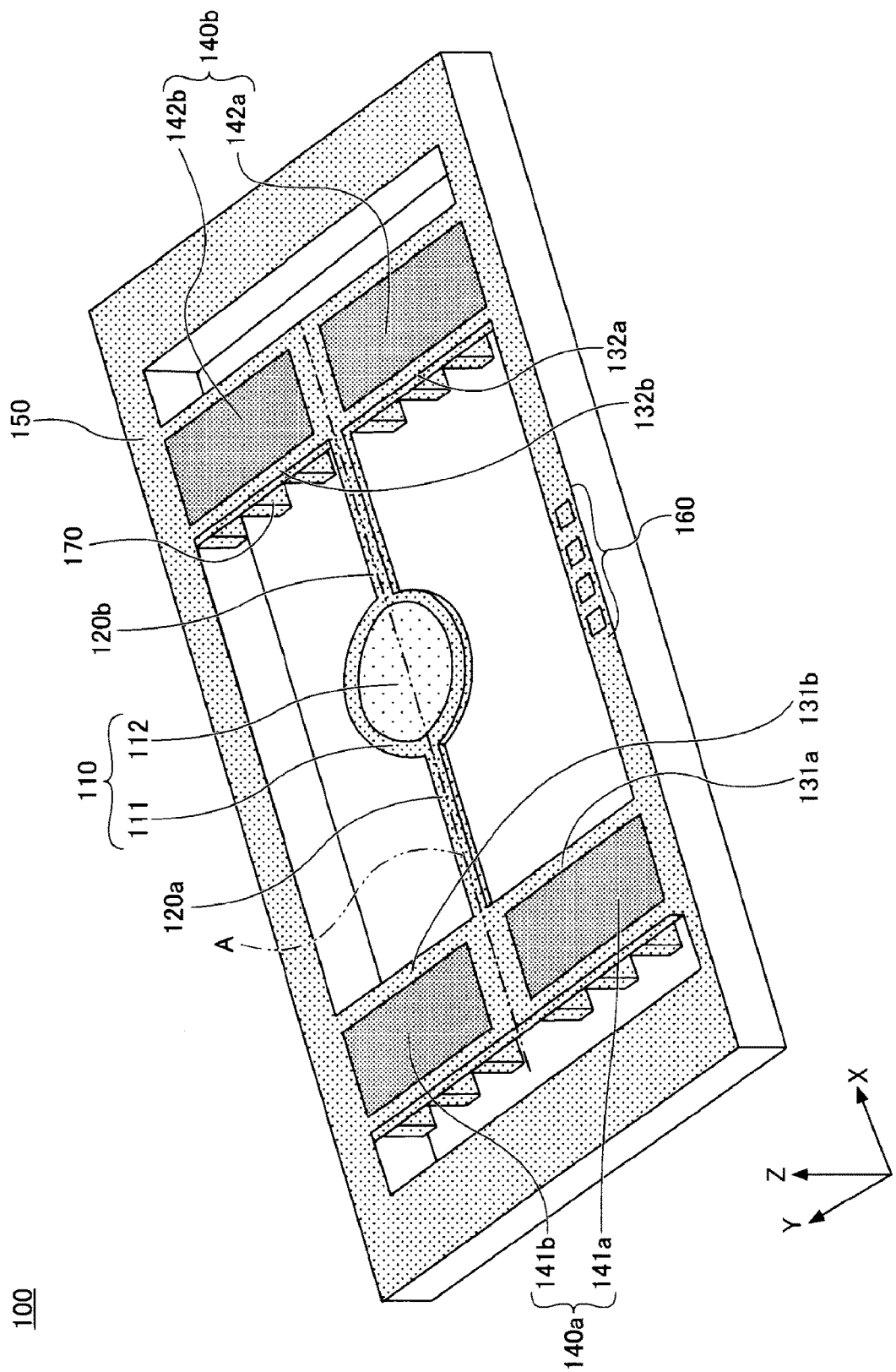
FIG. 13 is a perspective view of the light deflector according to the first embodiment of the present disclosure.
Figure 14:
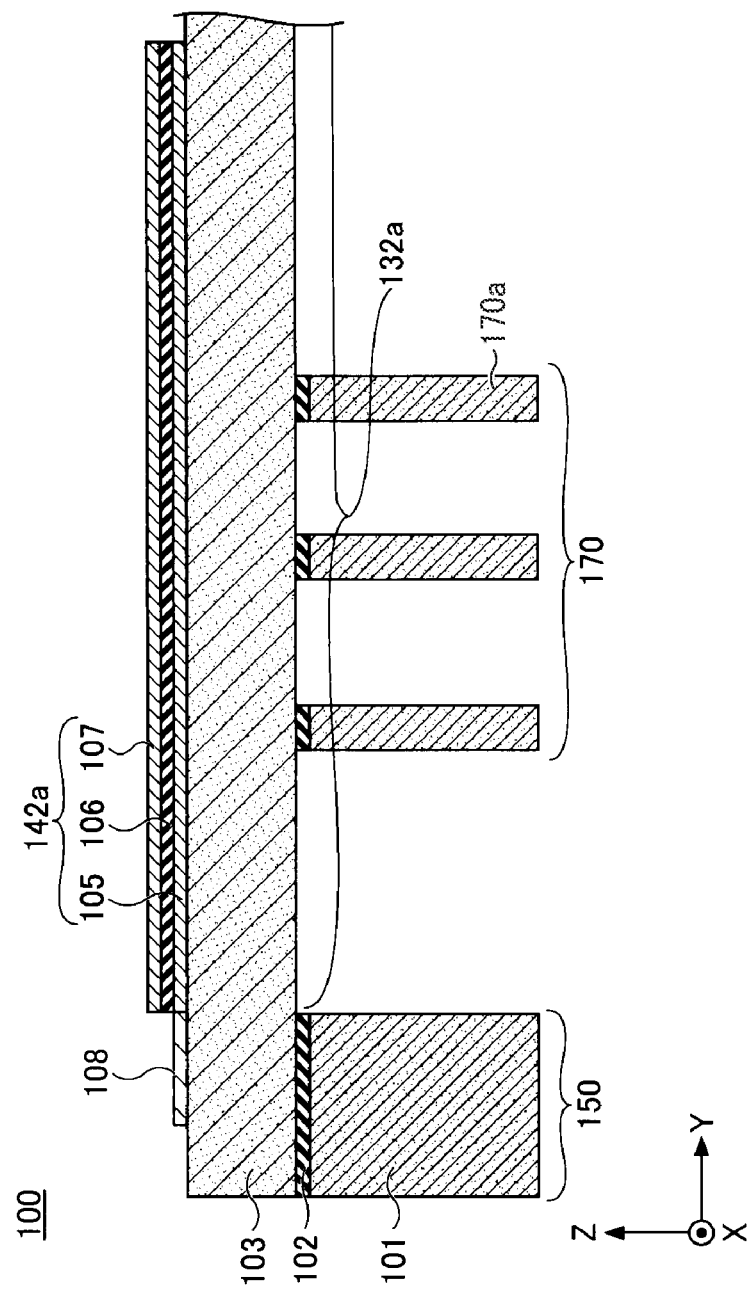
FIG. 14 is a cross-sectional view of a part of the light deflector taken along line E-E in FIG. 12.
Figure 15:
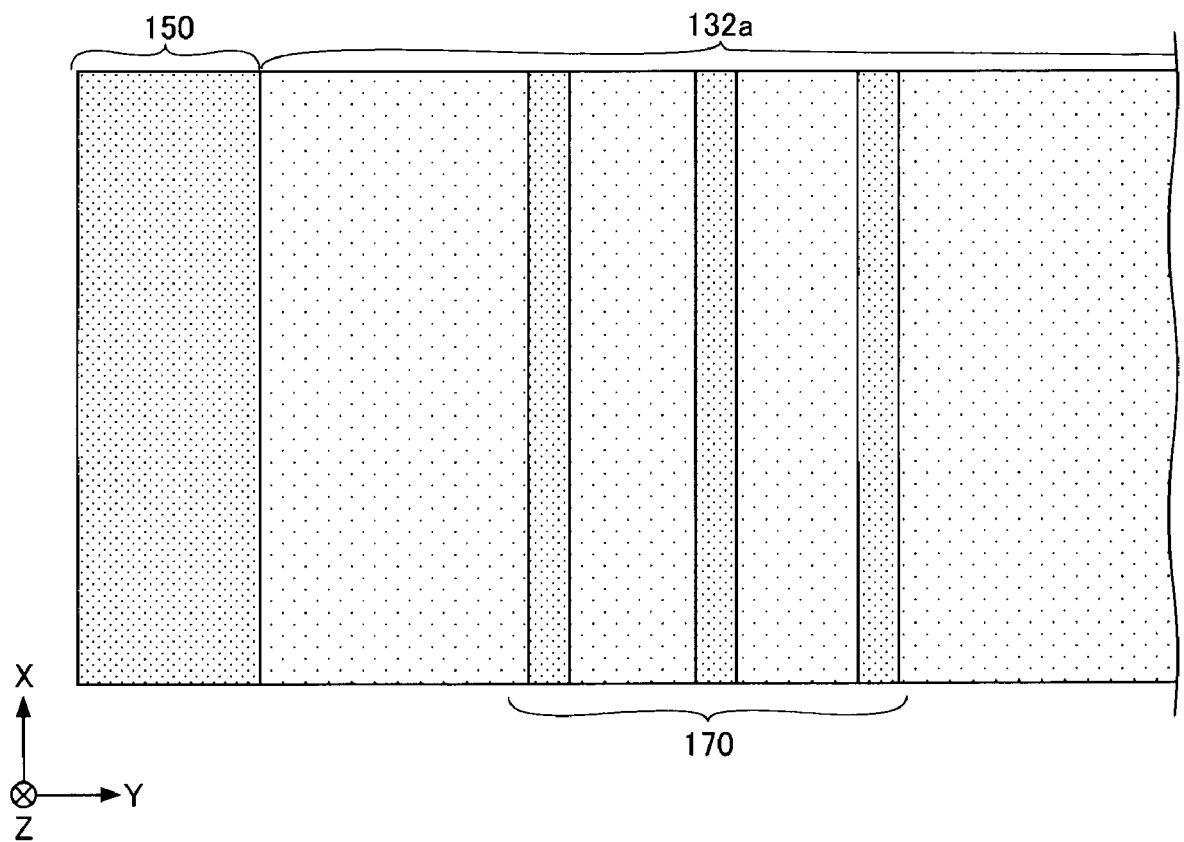
FIG. 15 is a bottom view of the part of the light deflector in FIG. 14 as viewed from the back side of the light deflector.

FIG. 12 is a plan view of the light deflector according to the first embodiment of the present disclosure, as viewed from the front side (the reflecting-surface side) of the light deflector 13. FIG. 13 is a perspective view of the light deflector 100 according to the first embodiment of the present disclosure, as viewed from the front side of the light deflector 100. FIG. 14 is a cross-sectional view of a part of the light deflector 100 taken along line E-E in FIG. 12. FIG. 15 is a bottom view of the part of the light deflector 100 in FIG. 14 as viewed from the back side (the opposite side of the reflecting surface) of the light deflector 100.

The light deflector 100 as illustrated in FIGS. 12 to 15 has a both-side-supported structure that rotates a movable unit having a reflecting surface to deflect light incident on the reflecting surface in one axis direction (around an axis A parallel to the X-axis).

The light deflector 100 is configured to rotate a mirror unit 110 around the axis A. In other words, the light deflector 100 uniaxially rotates the mirror unit 110 to uniaxially deflect incident light while scanning. The following describes the structure of the light deflector 100.

The light deflector 100 includes a mirror unit 110 having a reflecting surface 112 that reflects incident light, torsion beams 120a and 120b, connecting parts 131a and 131b, connecting parts 132a and 132b, drive units 140a and 140b, a stationary part 150, and electrode connecting parts 160.

The light deflector 100 includes, for example, one silicon on insulator (SOI) substrate that is formed by any appropriate treatment method, such as etching. On the formed SOI substrate, the reflecting surface 112, the drive units 140a and 140b are formed, which constitutes a single integrated structure of the above-described components. The above-described multiple elements may be formed after the SOI substrate is molded, or may be formed while the SOI substrate is being molded.

The SOI substrate is a substrate in which, on a first silicon layer formed of single crystal silicon (Si), a silicon oxide layer is formed, and on the silicon oxide layer, a second silicon layer formed of single crystal silicon is formed. Hereinafter, the first silicon layer is referred to as silicon support layer 101, the second silicon layer is referred to as silicon active layer 103, and the silicon oxide layer is referred to as silicon oxide layer 102 (see FIG. 14).

The silicon active layer 103 has a smaller thickness in the Z-axis direction than the thickness in the X-axis direction or the Y-axis direction. With such a configuration, any member made of the silicon active layer 103 serves as an elastic member having elasticity. The silicon active layer 103 has a thickness of, for example, about 20 to 60 micrometers (μm). The SOI substrate does not have to be planar, and may have, for example, a curvature.

In the following examples, the light deflector 100 is formed of the SOI substrate. Alternatively, any substrate that can be integrally formed by etching treatment or the like and can have partial elasticity can be used. The member used for forming the light deflector 100 is not limited to the SOI substrate. Examples of such a substrate include a silicon (Si) substrate and an aluminum (Al) substrate.

The mirror unit 110 is rotatable around the axis A and includes a mirror-unit base 111 that has, for example, a round shape or an elliptical shape and the reflecting surface 112 formed on the +Z-side surface of the mirror-unit base 111. The mirror-unit base 111 is composed of, for example, the silicon active layer 103. The reflecting surface 112 includes a metal thin film containing, for example, aluminum (Al), gold (Au), or silver (Ag).

The mirror unit 110 may include a rib for strengthening the mirror-unit base 111, on the −Z-side surface of the mirror-unit base 111. The rib is formed of, for example, the silicon support layer 101 and the silicon oxide layer 102, and can prevent distortion of the reflecting surface 112 caused by the movement of the mirror unit 110.

The center (center of gravity) of the mirror unit 110 lies on the axis A, which is the center axis of the torsion beams 120a and 120b, for example. However, the center (center of gravity) of the mirror unit 110 may be offset from the axis A, which is the center axis of the torsion beams 120a and 120b.

The connecting parts 131a and 131b are strip-shaped cantilevers linearly provided to serve as a bridge between facing inner peripheral surfaces of the stationary part 150. One ends of the connecting parts 131a and 131b are connected to the stationary part 150, and the other ends of the connecting parts 131a and 131b are connected to each other.

The connecting parts 132a and 132b are strip-shaped cantilevers linearly provided to serve as a bridge between facing inner peripheral surfaces of the stationary part 150. One ends of the connecting parts 132a and 132b are connected to the stationary part 150, and the other ends of the connecting parts 132a and 132b are connected to each other. The connecting parts 131a and 131b and the connecting parts 132a and 132b are arranged across the mirror unit 110 to be line-symmetric about an axis passing through the center of the reflecting surface 112 and parallel to the Y-axis, for example.

The connecting parts 131a, 131b, 132a, and 132b are each formed of material selected from Si, $Al_2O_3$, SiC, and SiGe, for example. The connecting parts 131a, 131b, 132a, and 132b are preferably made of Si because an SOI substrate is used to manufacture the light deflector 100. When the light deflector 100 is formed of an SOI substrate, the connecting parts 131a, 131b, 132a, and 132b are each composed of, for example, the silicon active layer 103.

The torsion beams 120a and 120b are a pair of elastic supporting parts. One end of each the torsion beams 120a and 120b is connected to the mirror-unit base 111, and each of the torsion beams 120a and 120b extends in the axis-A direction to support the mirror unit 110 such that the mirror unit 110 is movable and rotatable about the axis A. The torsion beams 120a and 120b are each composed of, for example, the silicon active layer 103.

The other end of the torsion beam 120a is connected to the connection point of the connecting part 131a and the connecting part 131b. The other end of the torsion beam 120b is connected to the connection point of the connecting part 132a and the connecting part 132b. The longitudinal direction of the torsion beam 120a is perpendicular to the longitudinal direction of each of the connecting parts 131a and 131b, and the longitudinal direction of the torsion beam 120b is perpendicular to the longitudinal direction of each of the connecting parts 132a and 132b.

As described above, the connecting part 131a and the connecting part 131b are arranged on both sides of the axis A, which is the central axis of the torsion beam 120a, and the connecting part 132a and the connecting part 132b are arranged on both sides of the axis A, which is the central axis of the torsion beam 120b.

The connecting parts 131a and 131b and the connecting parts 132a and 132b support the mirror unit 110 and the torsion beams 120a and 120b from both sides with respect to the stationary part 150. Four connection points between the connecting parts 131a and 131b, the connecting parts 132a and 132b, and the stationary part 150 are stationary ends.

The drive unit 140a includes strip-shaped drive elements 141a and 141b whose longitudinal direction is a direction perpendicular to the axis A (i.e., a direction parallel to the Y axis). The drive element 141a is formed on the surface of the connecting part 131a, that is, the surface on which the reflecting surface 112 is formed, and the drive element 141b is formed on the surface of the connecting part 131b. The drive elements 141a and 141b are arranged to be line-symmetric about the axis A, for example.

Similarly, the drive unit 140a includes strip-shaped drive elements 142a and 142b whose longitudinal direction is a direction perpendicular to the axis A (i.e., a direction parallel to the Y axis). The drive element 142a is formed on the surface of the connecting part 132a, and the drive element 142b is formed on the surface of the connecting part 132b. The drive elements 142a and 142b are arranged to be line-symmetric about the axis A, for example.

The drive elements 141a, 141b, 142a, and 142b are piezoelectric elements, and each of the drive elements 141a, 141b, 142a, and 142b (the drive element 142a is illustrated as an example in FIG. 14) includes a lower electrode 105, a piezoelectric circuit 106, and an upper electrode 107, which are sequentially formed in that order on the +Z-side surface of the silicon active layer 103 serving as an elastic member.

The lower electrode 105 and the upper electrode 107 are each formed of, for example, gold (Au) or platinum (Pt). The piezoelectric circuit 106 is made of, for example, lead zirconate titanate (PZT), which is a piezoelectric material.

The stationary part 150 is, for example, a rectangular supporting member formed to surround the mirror unit 110. The stationary part 150 is formed of, for example, the silicon support layer 101, the silicon oxide layer 102, and the silicon active layer 103. The stationary part 150 does not have to be formed so as to completely surround the mirror unit 110, and an opening may be provided in the vertical direction (the Y-direction) in FIG. 12, for example.

The electrode connecting parts 160 are formed, for example, on the +Z-side surface of the stationary part 150. The electrode connecting parts 160 are electrically connected to, for example, the upper electrode and the lower electrode of each of the drive elements 141a, 141b, 142a and 142b through electrode wiring (e.g., a wire 108 in FIG. 14) made of, for example, aluminum (Al).

The electrode connecting parts 160 are electrically connected to, for example, a control device outside the light deflector 100. At least one of the upper electrode and the lower electrode of each of the drive elements 141a, 141b, 142a and 142b may be directly connected to the electrode connecting parts 160, or may be indirectly connected to the electrode connecting parts 160 by connecting the electrodes to each other.

Each component may have any shape without limitation to the shapes according to the present embodiments, as long as the mirror unit 110 is rotatable about the axis A. The torsion beams 120a and 120b, and the connecting parts 131a, 131b, 132a and 132b may have, for example, a shape with curvature.

In some examples, mirror unit 110 may be directly coupled to the connecting parts 131a and 131b and the connecting parts 132a and 132b without the torsion beams 120a and 120b between the connecting parts 131a and 131b and the connecting parts 132a and 132b.

In the present embodiment, the mirror unit 110 and the torsion beams 120a and 120b are movable. Without the torsion beams 120a and 120b, only the mirror unit 110 is movable.

In some other examples, an insulating layer composed of, for example, an silicon oxide layer may be formed at at least one of the +Z-side surface of the upper electrode of each of the drive units 140a and 140b and the +Z-side surface of the stationary part 150.

In this case, electrode wiring is provided on the insulating layer, and the insulating layer is partially removed as an opening or is not formed at a connection spot where the upper electrode or the lower electrode and the electrode wiring are connected, so that the drive units 140a and 140b, the second driving circuits 130a and 130b, and the electrode wiring can be designed with a higher degree of freedom, and furthermore, a short circuit as a result of contact between electrodes can be controlled. The silicon oxide layer 102 also serves as an anti-reflection member.

As described above, in the light deflector 100, the mirror unit 110 and the torsion beams 120a and 120b, which are all movable, are supported by the stationary part 150, using connecting parts 131a, 131b, 132a, and 132b, such that the mirror unit 110 and the torsion beams 120a and 120b are rotatable about the axis A.

The connecting parts 131a, 131b, 132a, and 132b are caused to oscillate by the inverse piezoelectric effects of the drive elements 141a, 141b, 142a, and 142b of the drive units 140a and 140b, and the oscillation of the connecting parts 131a, 131b, 132a, and 132b applies a twist to the torsion beams 120a and 120b. Twisting of the torsion beams 120a and 120b causes the mirror unit 110 to oscillate.

In other words, the drive units 140a and 140b causes the connecting parts 131a, 131b, 132a, and 132b to deform, and thereby cause the movable unit (the mirror unit 110 and the torsion beams 120a and 120b) to oscillate.

More specifically, a voltage is applied to the drive elements 141a, 141b, 142a, and 142b in the Z-direction, and the drive elements 141a, 141b, 142a, and 142b contract in directions parallel to the planes of the drive elements 141a, 141b, 142a, and 142b, respectively. Such contraction of the drive elements 141a, 141b, 142a, and 142b causes the torsion beams 120a and 120b to rotate around the axis A because each of the drive elements 141a, 141b, 142a, and 142b is a bimorph that acts on the silicon active layer 103.

A piezoelectric constant d31 or d33 of the piezoelectric circuit 106 of each of the drive elements 141a, 141b, 142a, and 142b does not take a zero value. Without any measures taken, applying voltage to each drive element might change a direction in which the torsion beams 120a and 120b are bent in addition to a direction in which the torsion beams 120a and 120b are twisted.

In other words, without any measures, when a voltage is applied to each drive element, a component other than a component in the rotation direction where the axis A is the rotation axis might be generated. In this case, the angle of oscillation (i.e., angle of deflection) of the mirror unit 110 might decrease as compared to the case in which external force in the rotation direction alone is applied to the torsion beams 120a and 120b.

The first embodiment of the present disclosure provides a rib 170 on the back side (i.e., a surface opposite to the surface on which the reflecting surface 112 is formed, that is, the −Z-side surface of the each connecting part) of each of the connecting parts 131a, 131b, 132a, and 132b so as to handle such a decrease in the angle of oscillation of the mirror unit 110. Each rib 170 includes a portion 170a whose longitudinal direction (the X-direction) is orthogonal to a direction in which each connecting part is bent (i.e., the Y-direction, and sometimes referred to as the bending direction).

In other words, when a first direction refers to a direction from one end of each connecting part (131a, 131b, 132a, 132b) where the connecting part is connected to the stationary part 150 to the other end that is connected to movable unit (120a, 120b), and a second direction refers to a direction orthogonal to the first direction in a plane of each connecting part, each rib 170 includes portions 170a each disposed with the longitudinal direction parallel to the second direction.

Hereinafter, the portions 170a each having the longitudinal direction X orthogonal to the direction at which each connecting part is bent (i.e., the Y-direction, which is also referred to as the bending direction in the present embodiment) is also referred to as an orthogonal portion having the longitudinal direction X orthogonal to the bending direction. Further, a portion having the longitudinal direction parallel to the bending direction (i.e., the Y-direction) of each connecting part is referred to as a parallel portion parallel to the longitudinal direction Y.

Each rib 170 is formed of, for example, a silicon support layer 101 and a silicon oxide layer 102, which constitute a layered structure. The silicon oxide layer 102 of each rib 170 is connected to the silicon active layer 103 of a corresponding one of the connecting parts 131a, 131b, 132a, and 132b. In the present embodiment, each rib 170 includes one or more orthogonal portions 170a each having the longitudinal direction X orthogonal to the bending direction, are arranged in parallel with the axis A at the back side of each of the connecting parts 131a, 131b, 132a, and 132b. Further, each rib 170 according to the present embodiment includes only the orthogonal portions 170a each having the longitudinal direction X orthogonal to the bending direction. In other words, each rib 170 according to the present embodiment does not include any parallel portion having the longitudinal direction Y parallel to the bending direction.

When each rib 170 includes a single orthogonal portion alone provided at the back side of each connecting part, the orthogonal portion is preferably disposed at the Y-directional center of the back side of each of the connecting parts 131a, 131b, 132a, and 132b, which are all flexible.

When each rib 170 includes a plurality of orthogonal portions provided on the back side of each of the connecting parts 131a, 131b, 132a, and 132b, the length of each rib 170 and spacing between the orthogonal portions are preferably determined so that the plurality of orthogonal portions are arranged to be symmetrical about the Y-directional center of the back side of each of the connecting parts 131a, 131b, 132a, and 132b, which are all flexible.

In the first embodiment, the rib 170 includes three orthogonal portions, each having the longitudinal direction X orthogonal to the bending direction, arranged at the back side of each of the connecting parts 131a, 131b, 132a, and 132b.

Such an arrangement of the ribs 170 including the orthogonal portions each having the longitudinal direction X orthogonal to the bending direction enables each of the connecting parts 131a, 131b, 132a, and 132b to be deformed one-dimensionally alone.

Assuming that a piezoelectric constant d31 in the X-direction and a piezoelectric constant d33 in the Y-direction each has finite values in the light deflector 100, applying voltage to each of the drive element 141a, 141b, 142a, and 142b generates stress (physical force) corresponding to each of the piezoelectric constants d31 and d33 in the X-direction and the Y-direction.

At this time, each rib 170 is serving to increase the X-directional flexural rigidity of the connecting parts 131a, 131b, 132a, and 132b as a whole, and the amount of deformation of the connecting parts 131a, 131b, 132a, and 132b according to the stress generated in the X-direction is reduced or eliminated. Each rib 170, however, is not serving to restrict the Y-directional flexural rigidity of the connecting parts 131a, 131b, 132a, and 132b as a whole. In other words, the Y-directional amount of deformation of the connecting parts 131a, 131b, 132a, and 132b is not restricted irrespective of presence or absence of the ribs 170. This enables only the component in the direction at which the torsion beams 120a and 120b are twisted to be obtained. This configuration enables the mirror unit 110 to effectively oscillate in accordance with the voltage applied to each of the drive elements 141a, 141b, 142a, and 142b, and thus increases an angle of oscillation of the mirror unit 110 per unit voltage, that is, an angle, at which the mirror unit 110 oscillates, per unit voltage.

In other words, the ribs 170, the longitudinal direction X of each of which is orthogonal to the bending direction, are provided at the back side of each of the connecting parts 131a, 131b, 132a, and 132b in the light deflector 100 according to the present embodiment. This arrangement restricts one of two directions at which the drive elements 141a, 141b, 142a, and 142b contract to handle the phenomenon that the drive elements 141a, 141b, 142a, and 142b contract in the two directions and cause the connecting parts 131a, 131b, 132a, and 132b to curve in the two directions. This restriction enables the deformation (i.e., contraction) of the drive elements 141a, 141b, 142a, and 142b only in the other direction (i.e., a desired direction) to act on the mirror unit 110 effectively. Thus, the angle of oscillation of the mirror unit 110 can be increased with a higher voltage efficiency.

Figure 16:
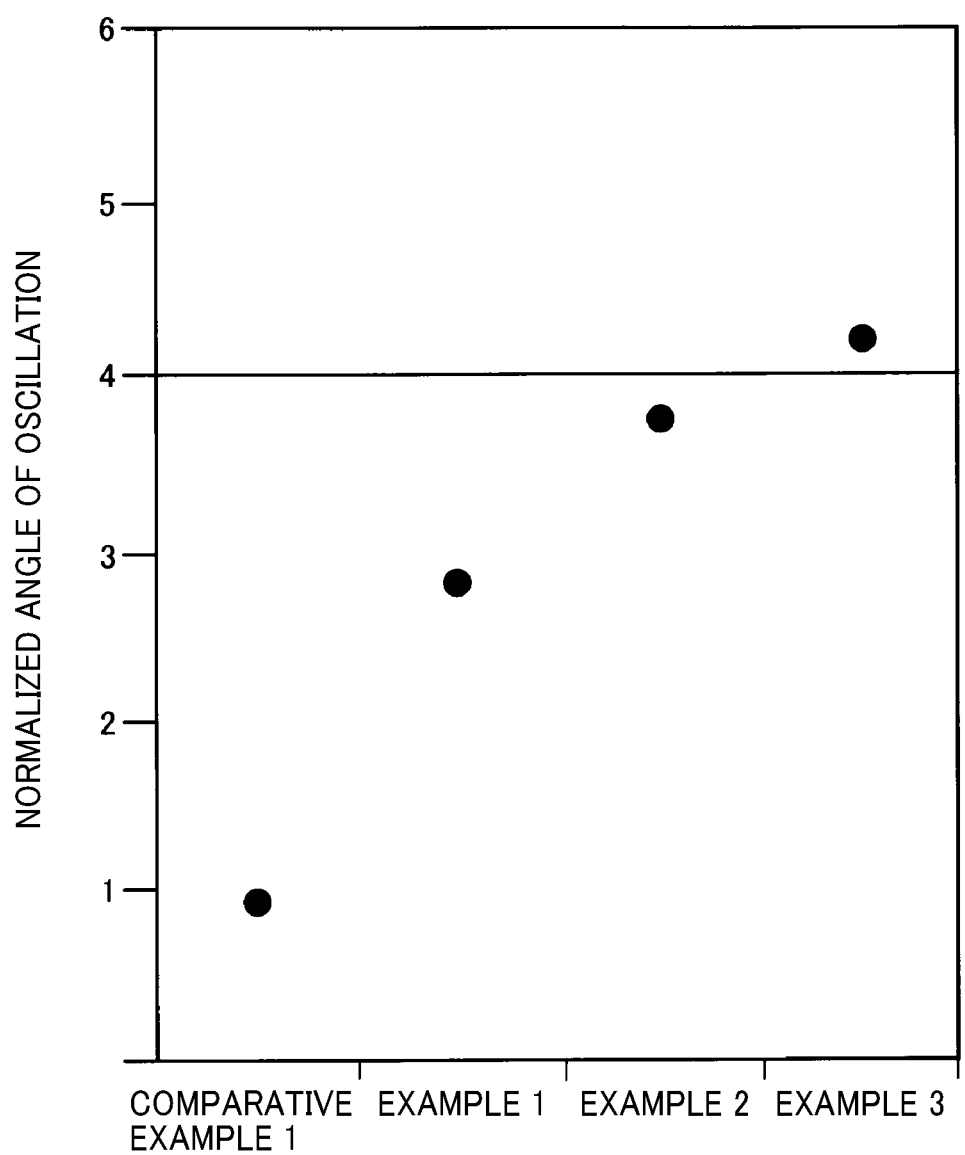
FIG. 16 is an illustration of the light deflector according to the first embodiment.

Note that the inventors have found through studies that the degree of increase in the angle of oscillation of the mirror unit 110 changes with the number of orthogonal portions 170a, each having the longitudinal direction X orthogonal to the bending direction, provided at the back side of each of the connecting parts 131a, 131b, 132a, and 132b. FIG. 16 is an illustration of the light deflector 100 according to examples of the first embodiment, and more specifically indicates a graph for describing the relation of the angle of oscillation of the mirror unit 110 and the number of orthogonal portions each having the longitudinal direction X in each rib 170 provided at the back side of each of the connecting parts 131a, 131b, 132a, and 132b.

In FIG. 16, the number of orthogonal portions provided at the back surface of each connecting part is 0 in comparative example, 2 in example 1, 3 in example 2, and 4 in example 3. The vertical axis of the graph in FIG. 16 represents the normalized angle of oscillation (related to amplitude) of the mirror unit 110.

As indicated by the graph in FIG. 16, it has been determined that providing one or more orthogonal portions (having the longitudinal direction X orthogonal to the bending direction) in each rib 170 at the back surface of each connecting part 131a, 131b, 132a, and 132b as in the examples 1-3 enables an increase in the angle of oscillation of the mirror unit 110 unlike the comparative example 1 without such an orthogonal portion.

It has also been determined that providing four orthogonal portions, whose longitudinal direction X is orthogonal to the bending direction, in the rib 170 at the back side of each connecting part increases the angle of oscillation the most when the number of orthogonal portions ranges from 0 to 4.

In particular, it has been determined that the angle of oscillation of the mirror unit 110 when four orthogonal portions 170a are provided in each rib 170 at the back side of each connecting part 131a, 131b, 132a, and 132b becomes four or more times the angle of oscillation in the comparative example 1 without any orthogonal portions.

The number of orthogonal portions 170a in each rib 170, however, might vary with a resonance frequency of the torsion beams 120a and 120b, the shape of each connecting part 131a, 131b, 132a, and 132b, and the shape of portions at which the torsion mirrors 120a and 120b, the mirror unit 110, and the connecting parts 131a, 131b, 132a, and 132b are connected to each other. In other words, the suitable number of orthogonal portions 170a in each rib 170 at the back side of each connecting part is not limited to the results indicated in FIG. 16.

The following describes a process of forming the rib 170 during the manufacturing of the light deflector 100. FIGS. 17A to 17C and FIGS. 18A and 18B are cross-sectional views for describing an example process of the light deflector 100 according to the first embodiment, and the cross-sectional views of FIGS. 17A to 17C and FIGS. 18A and 18B correspond to the cross-sectional view in FIG. 14.

Figure 17A:
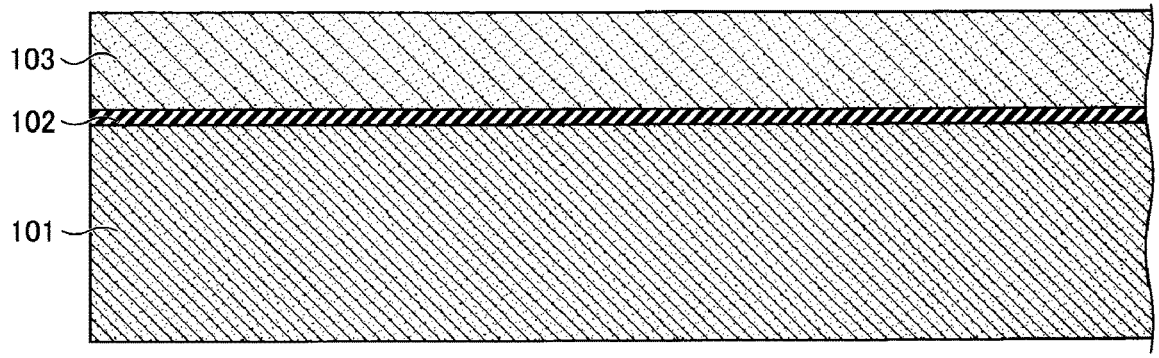
FIGS. 17A, 17B, and 17C are illustrations for describing a process of manufacturing the light deflector according to the first embodiment.

As illustrated in FIG. 17A, an SOI substrate of a three-layer structure, in which the silicon support layer 101, the silicon oxide layer 102, and the silicon active layer 103 are sequentially stacked, is prepared. The silicon support layer 101 has a thickness of, for example, 200 micrometer (μm), the silicon oxide layer 102 has a thickness of, for example, 0.5 μm, and the silicon active layer 103 has a thickness of, for example, 40 μm.

Figure 17B:
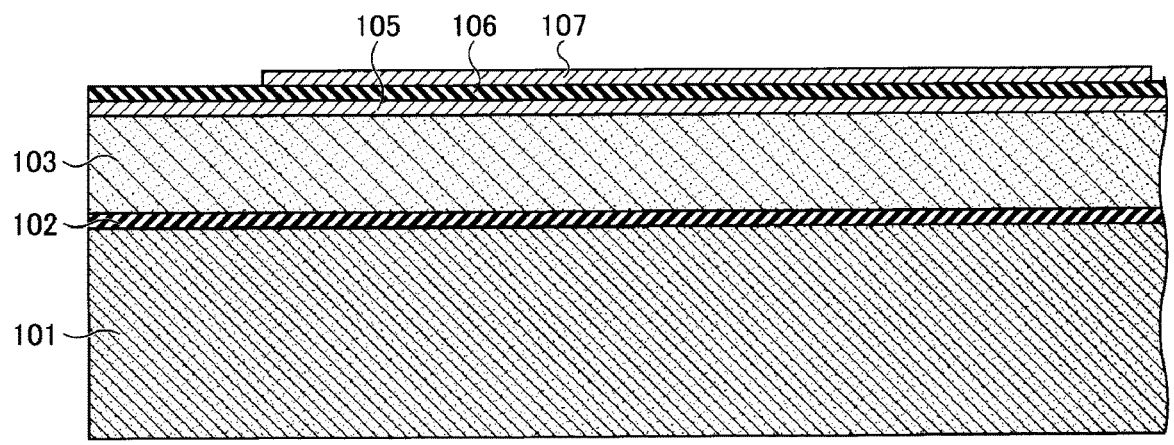

Next, as illustrated in FIG. 17B, the lower electrode 105 and the piezoelectric circuit 106 are sequentially formed on the entire surface of the silicon active layer 103, and then the upper electrode 107 is formed at an area, in which the drive units 140a and 140b are desired to be formed, on the piezoelectric circuit 106. The lower electrode 105 and the upper electrode 107 are formed of, for example, gold (Au) or platinum (Pt). The piezoelectric circuit 106 is formed of, for example, lead zirconate titanate (PZT) that is piezoelectric material.

Figure 17C:
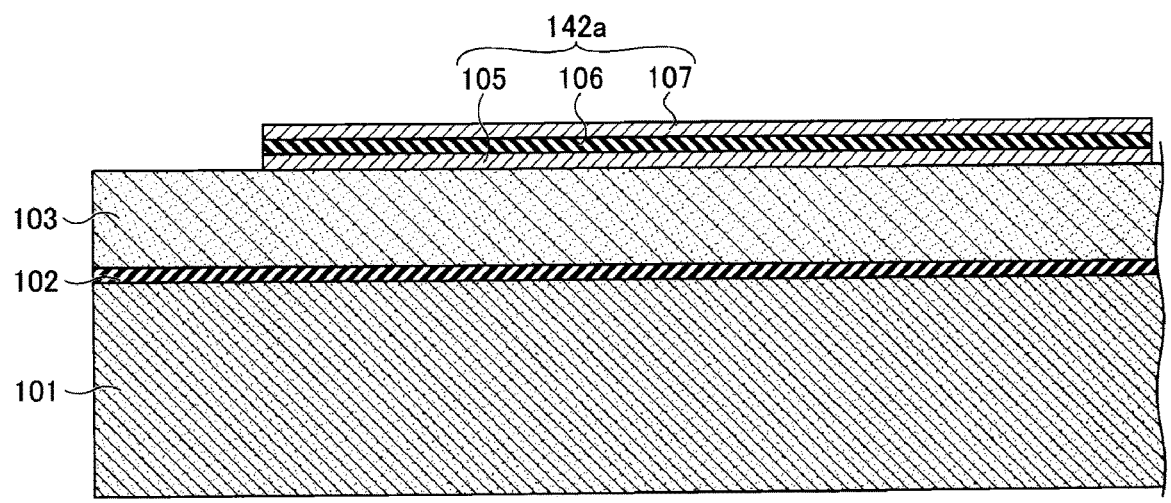

As illustrated in FIG. 17C, the lower electrode 105 and the piezoelectric circuit 106 other than the area where the upper electrode 107 is formed are then removed by etching. Thus, the drive units 140a and 140b (the drive elements 141a, 141b, 142a, and 142b), in which the lower electrode 105, the piezoelectric circuit 106, and the upper electrode 107 are sequentially stacked on top of each other, are provided (FIG. 17C indicates the drive element 142a of the drive unit 140b).

Figure 18A:
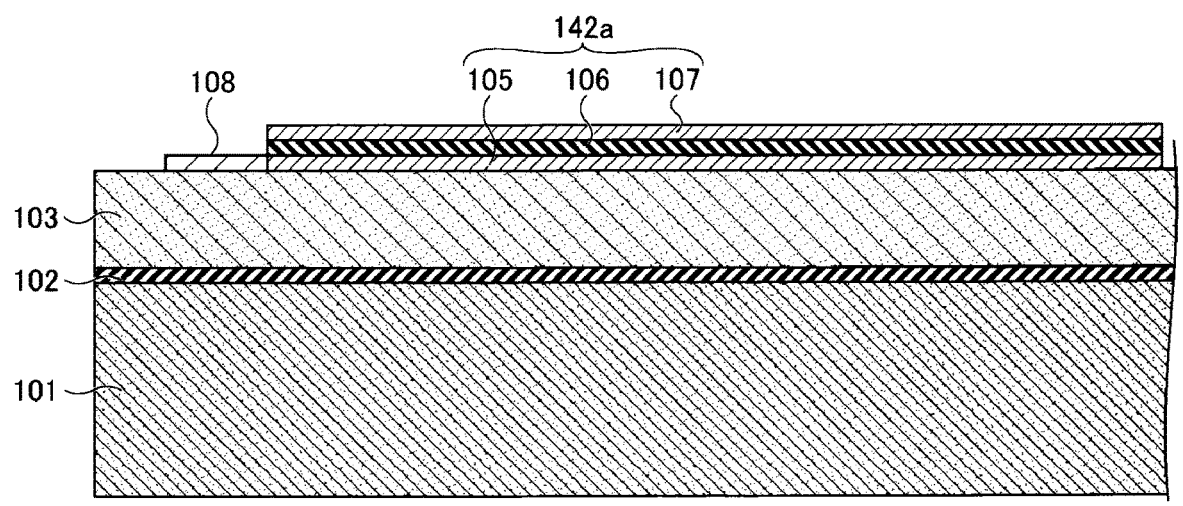
FIGS. 18A and 18B are illustrations of a process of manufacturing the light deflector according to the first embodiment.

Subsequently, as illustrated in FIG. 18A, electrode wiring (e.g., a wire 108) is formed to connect the electrode connecting parts 160 to the lower electrode 105 and the upper electrode 107 of each of the drive elements 141a, 141b, 142a, and 142b. The electrode connecting parts 160 and the electrode wiring (e.g., the wire 108) are formed of, for example, aluminum. Further, a reflecting surface 112 is formed on the surface of the mirror-unit base 111. The reflecting surface 112 is a thin metal film made of, for example, aluminum, gold (Au), or silver (Ag).

Figure 18B:
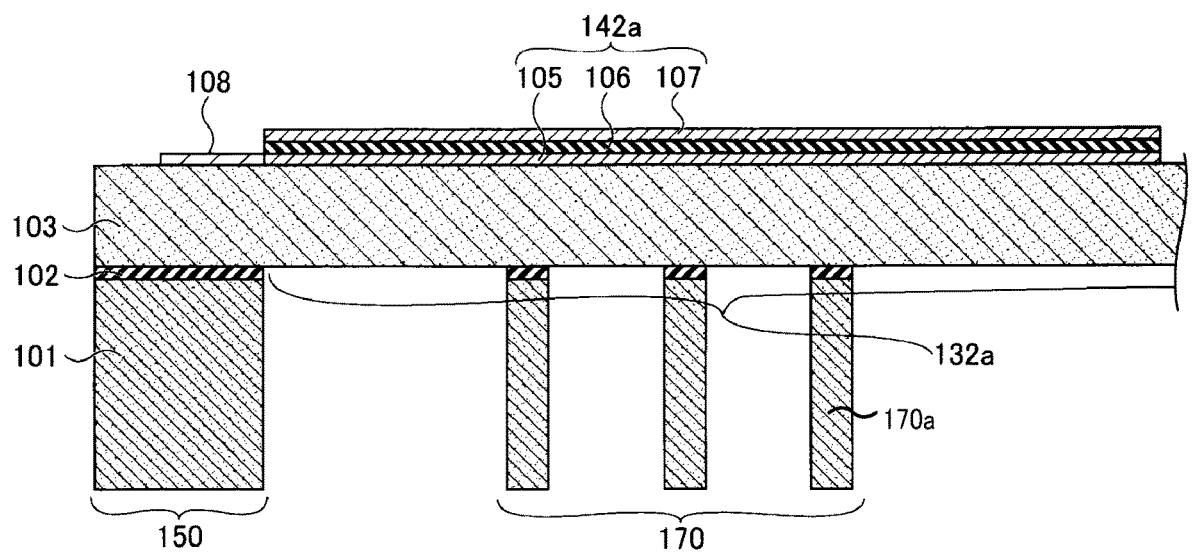

The silicon active layer 103 is etched to form the mirror-unit base 111 and the torsion beams 120a and 120b, and the stationary part 150 and the orthogonal portions 170a of the rib 170 are formed as illustrated in FIG. 18B. The rib 170 is formed on a surface of the SOI substrate, which is at the opposite side of the surface on which the drive units 140a and 140b are formed.

The semiconductor lithography technique is used to form a resist pattern that covers areas at which the stationary part 150 and the rib 170 (the orthogonal portions 170a) are to be formed in the process of forming the stationary part 150 and the rib 170. Then, the SOI substrate is etched through inductively coupled plasma (ICP) etching (i.e., using high-density plasma) using the resist pattern as mask so as to remove the silicon support layer 101 in areas not covered by the resist pattern. For the etching, for example, a Bosch process in which an etching step and a deposition step are repeated can be applied.

Subsequently, the silicon oxide layer 102 that is exposed by removing the silicon support layer 101 is removed by, for example, dry etching. Then, the resist pattern is removed by dry ashing using oxygen plasma, for example so that the light deflector 100 provided with the rib 170 is formed. Through the manufacturing process described above, the rib 170 (the orthogonal portion 170a) is formed of the silicon support layer 101 and the silicon oxide layer 102.

With the above-described process that includes a process of drying etching the silicon oxide layer 102, a portion of each of the connecting parts 131a, 131b, 132a, and 132b where the orthogonal portions 170a of the rib 170 are provided has a three-layer structure in which the silicon support layer 101, the silicon oxide layer 102, and the silicon active layer 103 are sequentially stacked on top of each other. The remaining portion of each of the connecting parts 131a, 131b, 132a, and 132b where the orthogonal portions 170a, i.e., the rib 170 is not provided has a single-layer structure of the silicon active layer 103.

This configuration achieves an increase in the X-directional strength of the connecting parts 131a, 131b, 132a, and 132b while maintaining the flexibility of each of the connecting parts 131a, 131b, 132a, and 132b.

The manufacturing process described with reference to FIGS. 17A to 17C and FIGS. 18A and 18B provides a light deflector 100 having a higher rigidity and better oscillation characteristics without a significant change in the conventional manufacturing process. Further, as the conventional manufacturing process is not significantly changed, the rigidity and the optical characteristics of the light deflector 100 is increased without a significant increase in manufacturing cost.

A light deflector according to a second embodiment provided with a rib having a shape different from the shape of the rib according to the first embodiment is described below. In the following description, the same components as those in the first embodiment are not described.

Figure 20:
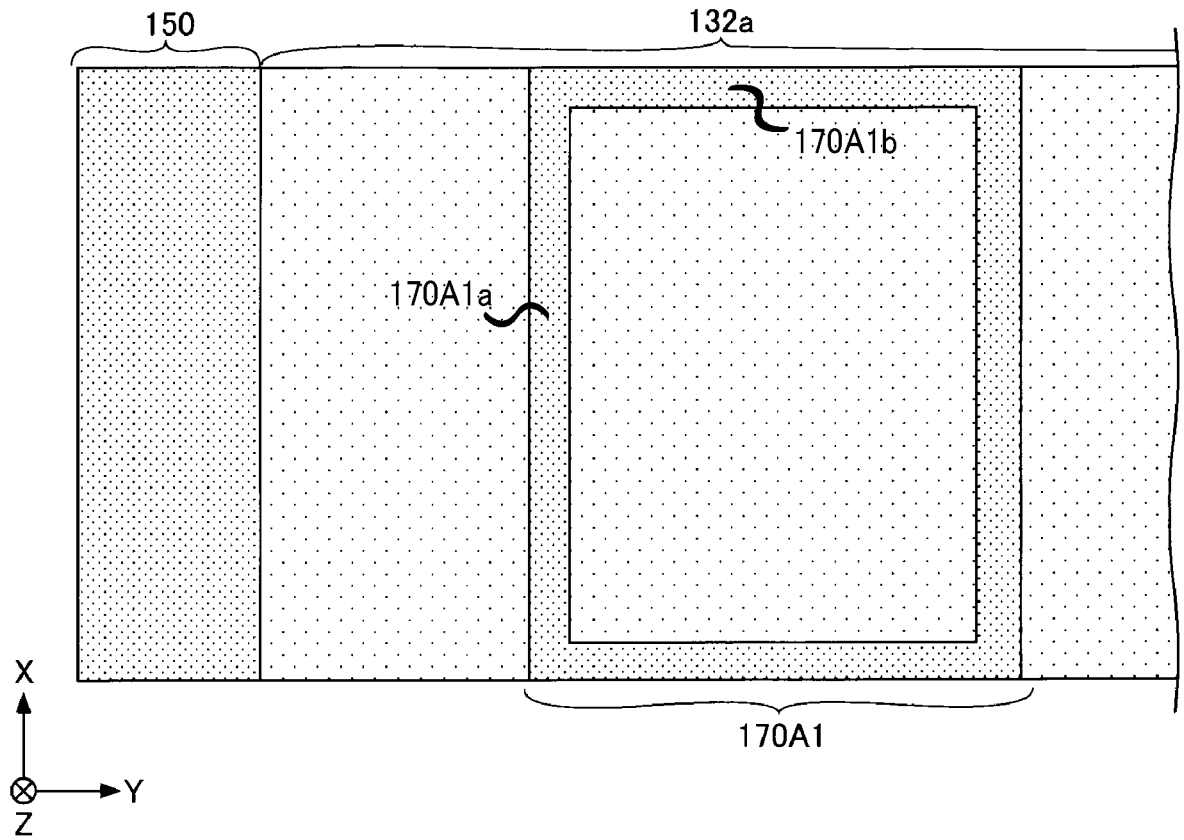
FIG. 20 is a bottom view of the part of the light deflector in FIG. 19 as viewed from the back side of the light deflector.

FIG. 19 is a cross-sectional view of a part of a light deflector 100A according to the second embodiment of the present disclosure, which corresponds to the cross-sectional view in FIG. 14 taken along line E-E in FIG. 12. FIG. 20 is a bottom view of the part of the light deflector 100A in FIG. 19 as viewed from the back side of the light deflector 100A (i.e., the opposite side of the reflecting surface).

The light deflector 100A as illustrated in FIGS. 19 and 20 differs in a rib 170A1 from the light deflector 100 according to the first embodiment (see FIGS. 12 to 15).

The rib 170A1 is formed on the back side of each of the connecting parts 131a, 131b, 132a, and 132b. The rib 170A1 is formed of, for example, the silicon support layer 101 and the silicon oxide layer 102.

The rib 170 of the light deflector 100 according to the first embodiment includes only the orthogonal portions each having the longitudinal direction X orthogonal to the bending direction, whereas the rib 170A1 of the light deflector 100A according to the second embodiment further includes parallel portions 170A1b in the longitudinal direction Y parallel to the bending direction in addition to the orthogonal portions 170A1a in the longitudinal direction X. In the rib 170A1, the orthogonal portion 170A1a is in contact with the parallel portion 170A1b. Further, the rib 170A1 forms an area closed by two orthogonal portions 170A1a having the longitudinal direction X and two parallel portions 170A1b having the longitudinal direction Y as viewed from the direction normal to the back surface of the connecting part. In other words, the rib 170A1 forms a frame shape as viewed from the bottom of the light deflector 100A (i.e., as viewed from the direction normal to the back surface of the connecting part), for example.

Each drive element, to which a small level of voltage is applied, deforms to a small extent. Accordingly, the effects of the drive elements on the torsion beams 120a and 120b connected to the drive elements are small.

However, when the voltage applied to each drive element is increased and each drive element deforms to a larger degree, the torsion beams 120a and 120b might cause each of the connecting parts 131a, 131b, 132a, and 132b to be twisted. Such a twist of the connecting parts 131a, 131b, 132a, and 132b causes the torsion beams 120a and 120b to bend in undesired directions, that is, changes a desired bending direction, thus adversely reducing an angle of oscillation of the mirror unit 110.

The rib 170A1 including both the orthogonal portions 170A1a having the longitudinal direction X and the parallel portions 170A1b having the longitudinal direction Y strengthens resistance to external force more than the rib 170 having the orthogonal portions 170a alone. This configuration prevents the connecting parts 131a, 131b, 132a, and 132b from being twisted due to an increase in deformation of each of the drive element by increasing voltage applied to each of the drive element, and achieves an increase in the angle of oscillation of the mirror unit 110.

The shape of the rib 170A1 is preferably symmetrical about the center axis of the connecting part 131a, 131b, 132a, or 132b along the longitudinal direction to deal with external force from various directions.

Figure 21:
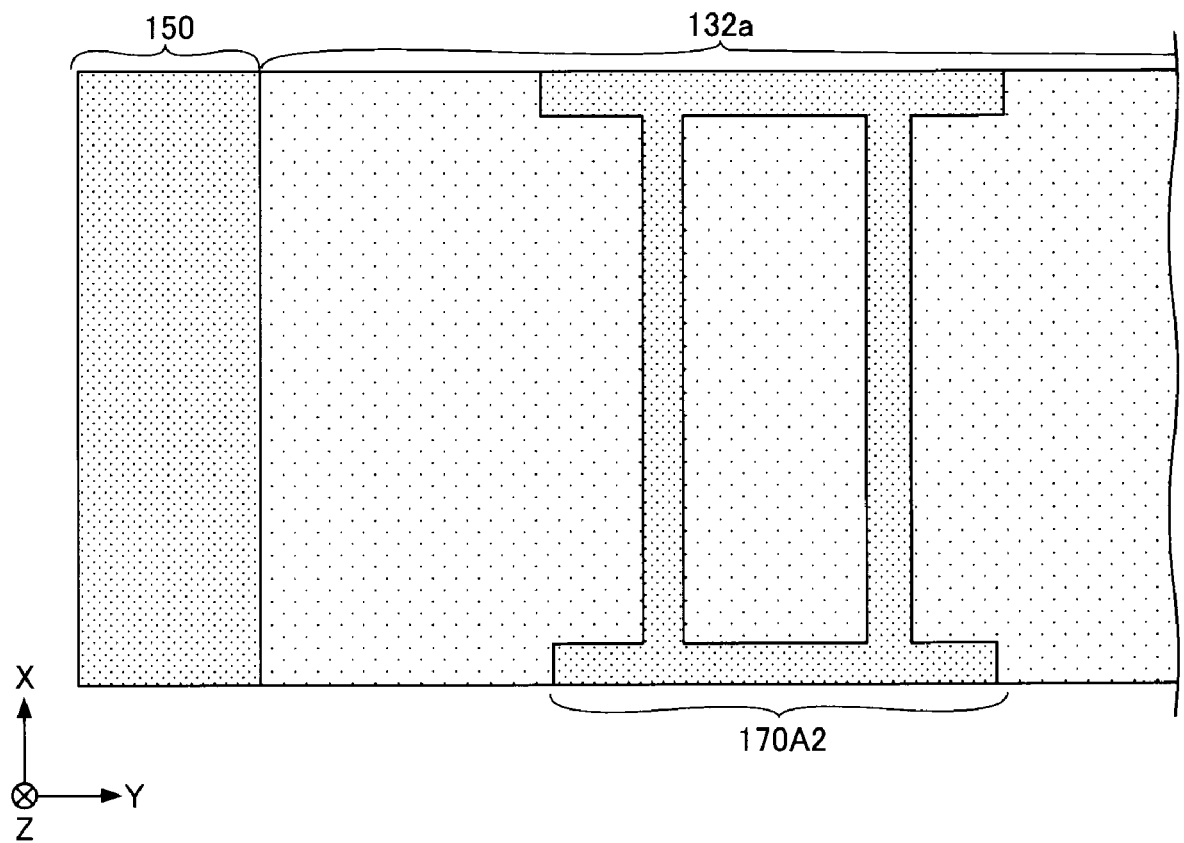
FIG. 21 is a bottom view of the part of the light deflector in FIG. 19 as viewed in the +Z direction, according to a first modification of the second embodiment.
Figure 22:
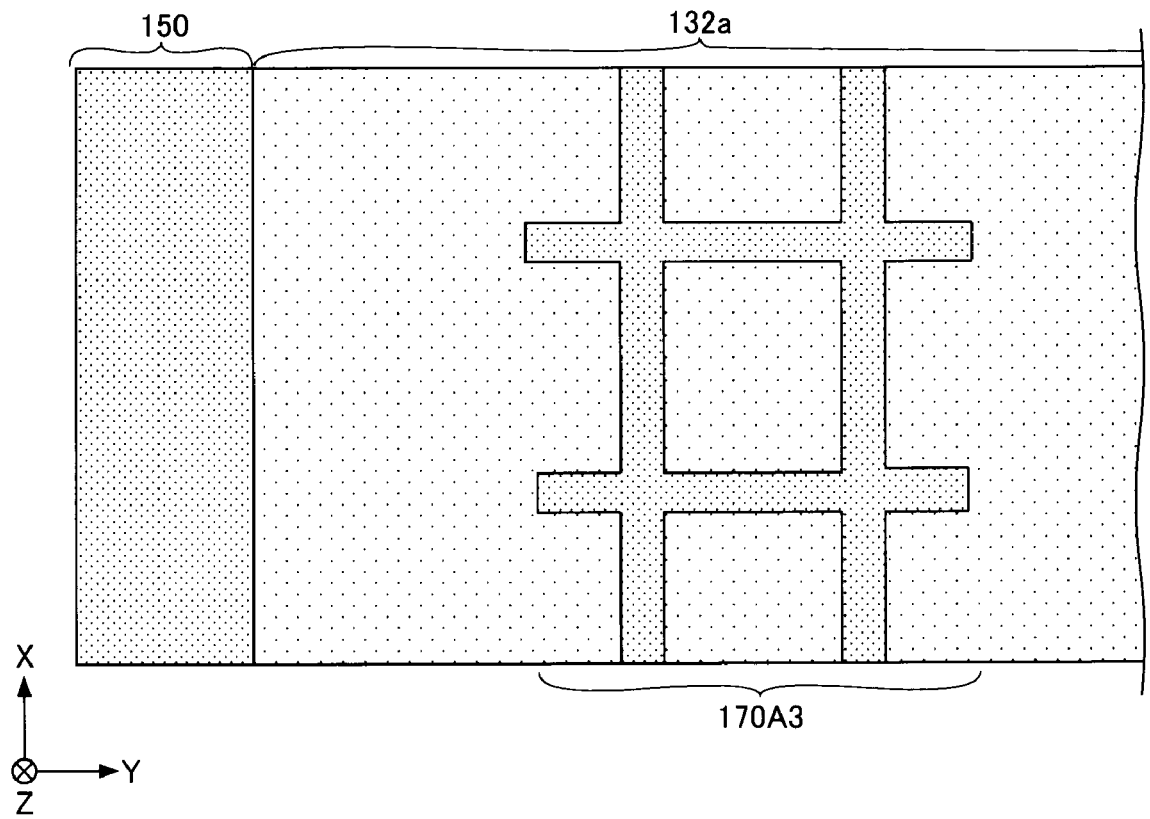
FIG. 22 is a bottom view of the part of the light deflector in FIG. 19 as viewed in the +Z direction, according to a second modification of the second embodiment.

The frame shape of the rib 170A1 in FIG. 20 is only one example, and no limitation is intended thereby. As illustrated in FIG. 21, for example, a rib 170A2 has a shape similar to Roman numeral "2". As illustrated in FIG. 22 for another example, a rib 170A3 has a shape similar to a number sign "#" or may have another shape.

Another shape refers to a shape in which each orthogonal portion having the longitudinal direction X and each parallel portion having the longitudinal direction Y are in contact with each other and an area closed by the orthogonal portions and the parallel portions is formed as viewed from the direction normal to the back surface of each connecting part.

Figure 23:
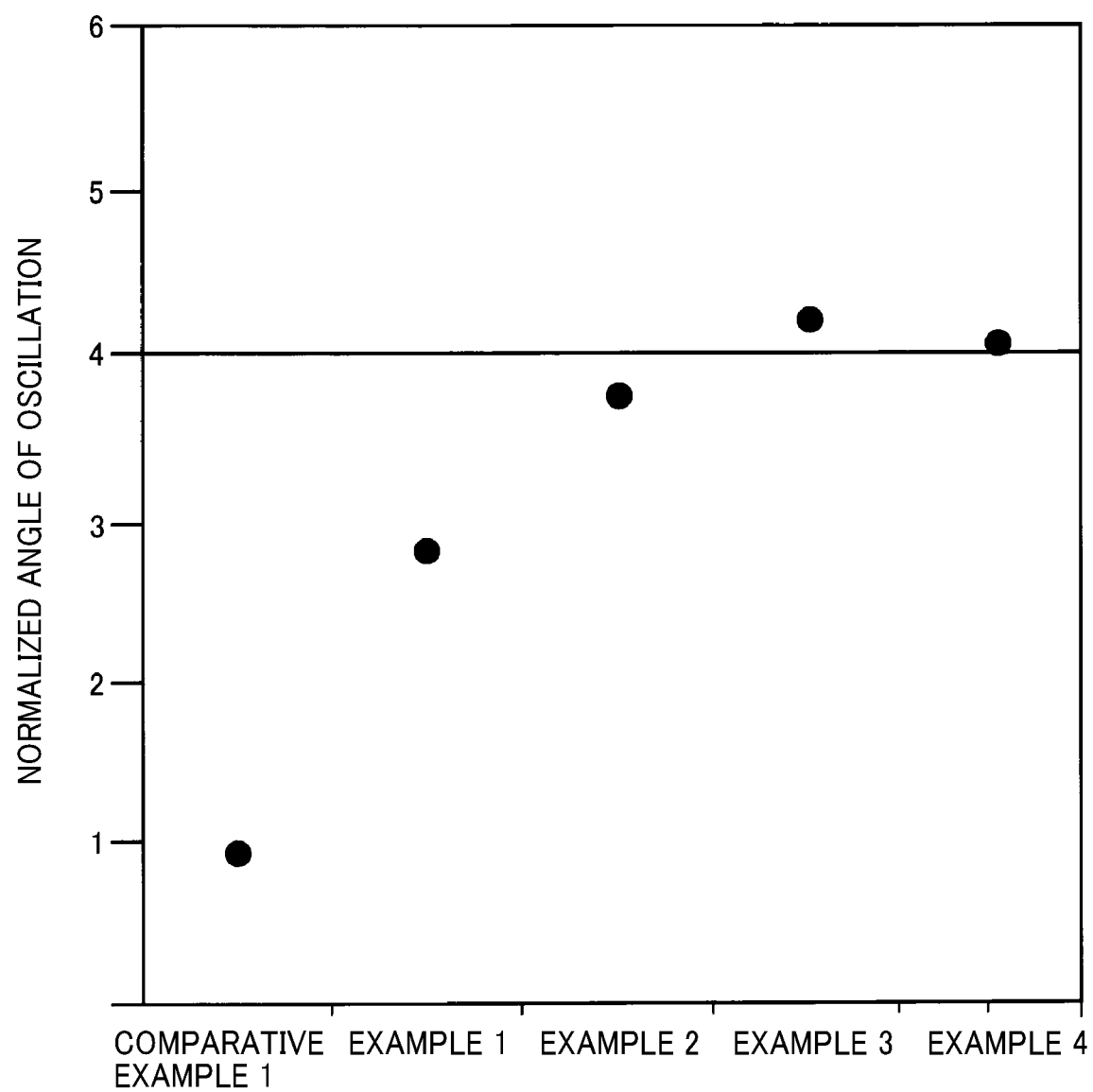
FIG. 23 is an illustration of the light deflector according to the second embodiment.

FIG. 23 is an illustration for describing the light deflector 100A according to the second embodiment, which indicates the results of a light deflector 100A according to an example of the second embodiment together with the results of FIG. 16.

In FIG. 23, example 4 indicates the light deflector 100A provided with the rib 170A1 in FIG. 20 according to the second embodiment. As illustrated in FIG. 23, it has been determine that the example 4 in which the light deflector is provided with the rib 170A1 in FIG. 20 exhibits the angle of oscillation of the mirror unit 110 four or more times the angle of oscillation obtained when the light deflector is provided with no rib (the comparative example 1).

The following describes a light deflector 100B according to a third embodiment, provided with a rib 170B1 whose shape is different from the shape of the rib 170 according to the first embodiment. In the following description, the same components as those in the first embodiment are not described.

Figure 24:
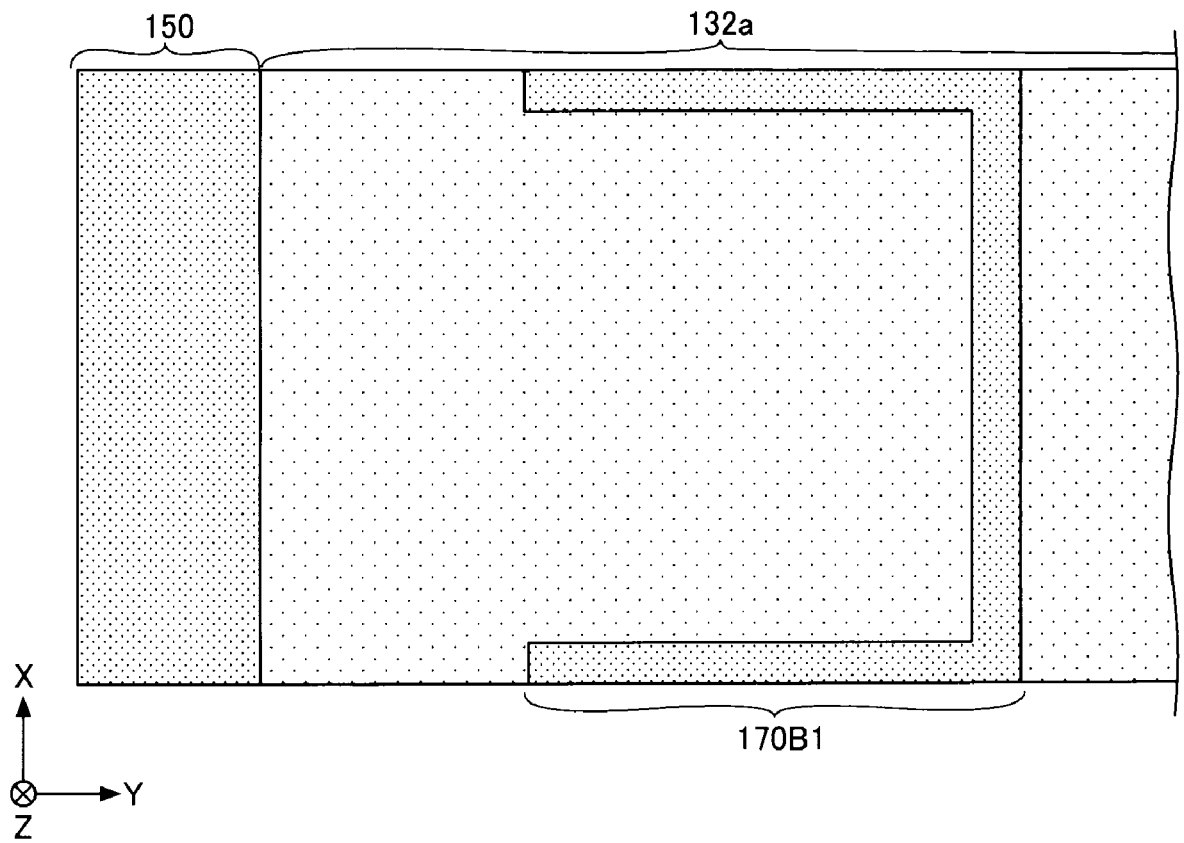
FIG. 24 is a bottom view of a part of a light deflector according to a third embodiment of the present disclosure.

FIG. 24 is a bottom view of a part of the light deflector 100B according to the third embodiment of the present disclosure, which corresponds to the bottom view in FIG. 20 taken along line E-E in FIG. 12.

The light deflector 100B in FIG. 24 differs in a rib 170B1 from the light deflector 100 according to the first embodiment in FIGS. 12 to 15.

The rib 170B1 is formed on the back side of each of the connecting parts 131, 131b, 132a, and 132b. The rib 170B1 is formed of, for example, the silicon support layer 101 and the silicon oxide layer 102.

The rib 170 of the light deflector 100 according to the first embodiment includes only the orthogonal portions 170a each having the longitudinal direction X orthogonal to the bending direction, whereas the rib 170B1 of the light deflector 100B according to the third embodiment further includes parallel portions in the longitudinal direction Y parallel to the bending direction in addition to the orthogonal portion having the longitudinal direction X. In the rib 170B1, the orthogonal portion having the longitudinal direction X and the parallel portions having the longitudinal direction Y are in contact with each other.

The rib 170B1 does not form an area closed by the orthogonal portions having the longitudinal direction X and the parallel portions having the longitudinal direction Y as viewed from the direction normal to the back surface of the connecting part, which is different from the rib 170A1 in FIG. 20. The rib 170B1 has, for example, a shape obtained by removing one of the orthogonal portions from the rib 170A1 of a frame shape.

The rib 170A1 in FIG. 20 might increase the moment of inertia due to an increase in mass. The shape of the rib 170B1 enables a reduction in the volume and mass of the rib as a whole, which further enables a reduction in the moment of inertia of the mirror unit 110. This configuration provided with the rib 170B1 thus increases the angle of oscillation of the mirror unit 110 more than the configuration provided with the rib 170A1.

The shape of the rib 170B1 is preferably symmetrical about the center axis along the longitudinal direction of the connecting parts 131a, 131b, 132a, and 132b to deal with external force from various directions.

Figure 25:
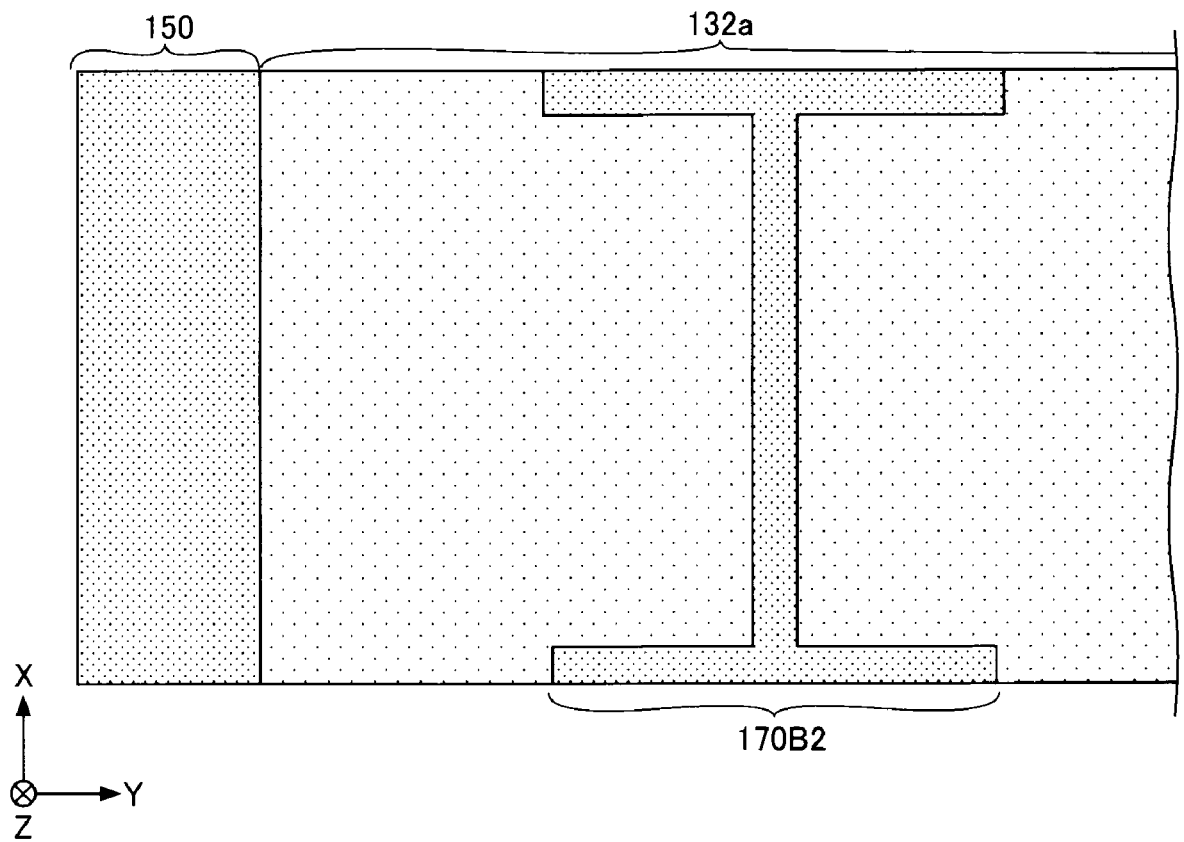
FIG. 25 is a bottom view of the part of the light deflector in FIG. 24 as viewed in the +Z direction, according to a first modification of the third embodiment.
Figure 26:
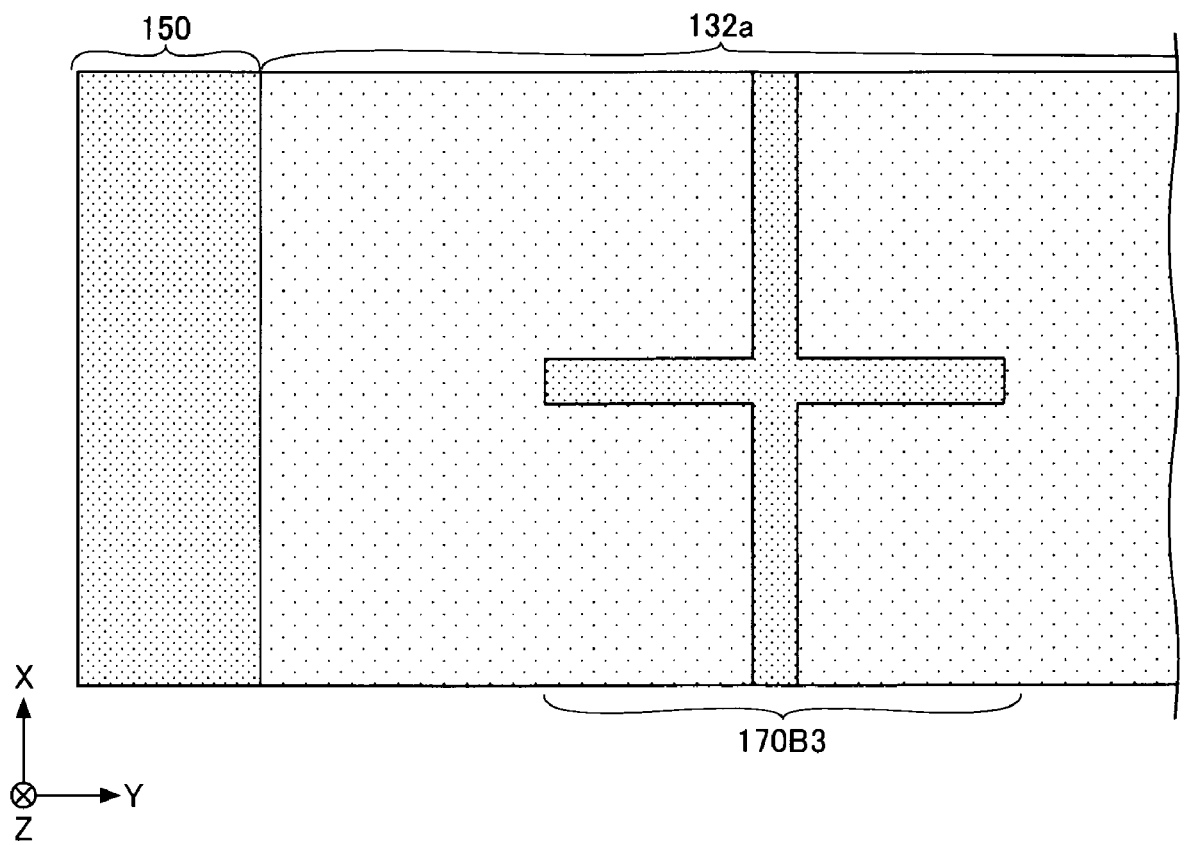
FIG. 26 is a bottom view of the part of the light deflector in FIG. 24 as viewed in the +Z direction, according to a second modification of the third embodiment.

The shape of the rib 170B1 is not limited to the shape in FIG. 24. Other examples of the rib may include a rib 170B2 having a shape similar to Roman numeral "1" as illustrated in FIG. 25, a cross-shaped rib 170B3 as illustrated in FIG. 26, or a rib having another shape. Another shape refers to a shape in which each orthogonal portion having the longitudinal direction X and each parallel portion having the longitudinal direction Y are in contact with each other.

Figure 27:
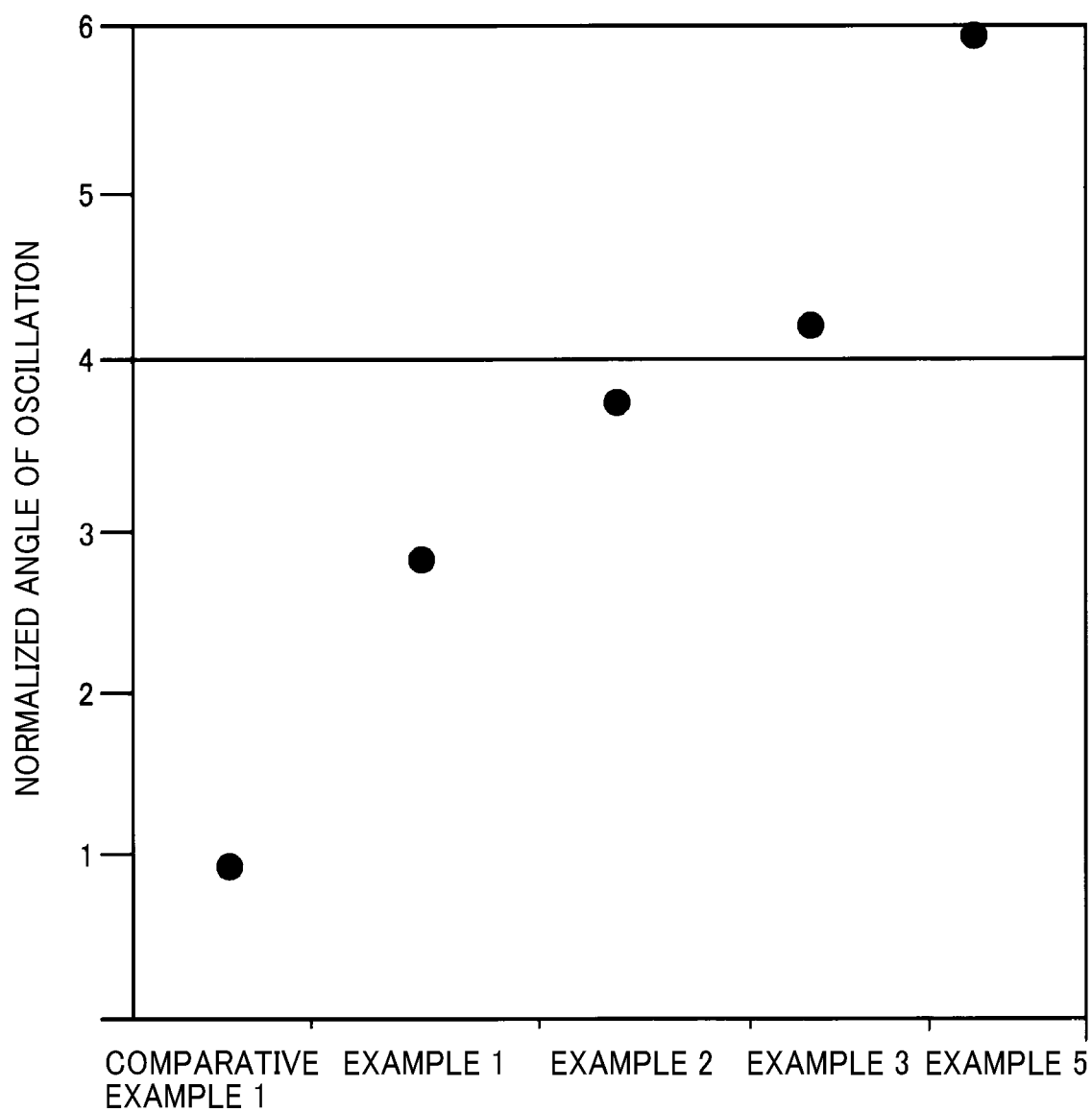
FIG. 27 is an illustration of the light deflector according to the third embodiment.

FIG. 27 is an illustration of the light deflector 100B according to the third embodiment, which indicates the result of the light deflector 100B according to an example of the third embodiment together with the results of FIG. 16. In FIG. 27, example 5 indicates the light deflector 100B provided with the rib 170B1 in FIG. 24 according to the third embodiment. As illustrated in FIG. 27, it has been determined that the example 5 in which the light deflector is provided with the rib 170B1 in FIG. 24 exhibits the angle of oscillation of the mirror unit 110 six or more times the angle of oscillation obtained when the light deflector is provided with no rib (the comparative example 1). This result of the example 5 is much better than the result of the example 4 in FIG. 23.

The following describes a light deflector 100C according to a fourth embodiment, provided with a rib 170C whose shape is different from the shape of the rib 170 according to the first embodiment. In the following description, the same components as those in the first embodiment are not described.

Figure 28:
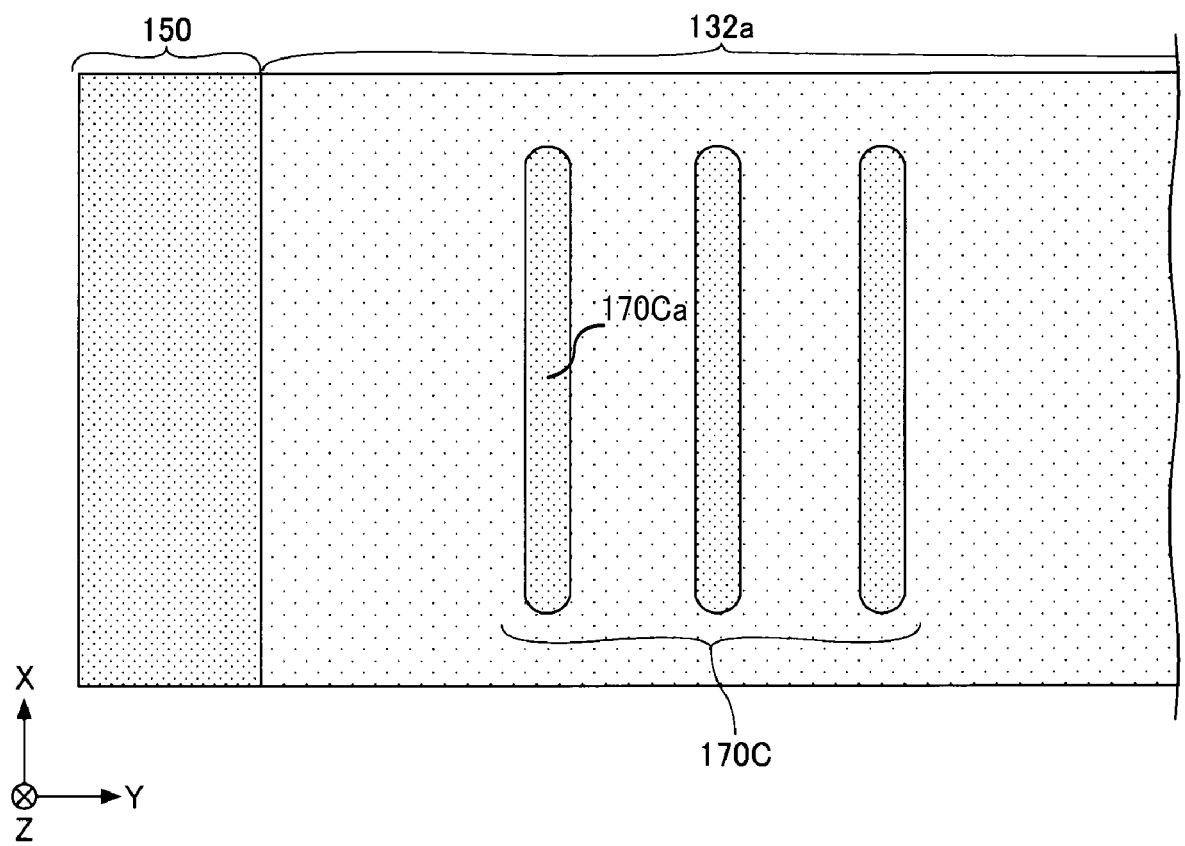
FIG. 28 is a bottom view of a part of a light deflector according to a fourth embodiment of the present disclosure.

FIG. 28 is a bottom view of a part of the light deflector 100C according to the fourth embodiment of the present disclosure, which corresponds to the bottom view in FIG. 20 taken along line E-E in FIG. 12.

The light deflector 100C in FIG. 28 differs in a rib 170C from the light deflector 100 according to the first embodiment in FIGS. 12 to 15.

The rib 170C is formed on the back side of each of the connecting parts 131, 131b, 132a, and 132b. The rib 170C is formed of, for example, the silicon support layer 101 and the silicon oxide layer 102. Unlike the rib 170, each orthogonal portion 170Ca of the rib 170C has a round edge (R-shaped end).

The connecting parts 131a, 131b, 132a, and 132b each is typically deformed in the Z-direction. At this time, if each orthogonal portion having the longitudinal length X in the rib 170C does not have a round edge, such non-rounded edges would serve as a stress concentration point and produce cracks in the connecting parts 131a, 131b, 132a, and 132b during the deformation.

Each orthogonal portion 170Ca of the rib 70C, however, does not serve as a stress concentration point because the edge is round-shaped. In other words, shaping the edge of each orthogonal portion 170Ca to be round prevents generation of a stress concentration point. This further prevents cracks from being produced in the connecting parts 131a, 131b, 132a, and 132b. Note that the orthogonal portion having the longitudinal direction X according to the other embodiments may have a round edge same as in the rib 170C.

The following describes a biaxial light deflector 200 according to a fifth embodiment, provided with the light deflector 100 according to the first embodiment. In the following description, the same components as those in the first embodiment are not described. In the description of the present embodiment, a main scanning is an optical scanning with the axis A as the center of rotation, and a sub-scanning is an optical scanning with the axis B as the center of rotation.

Figure 29:
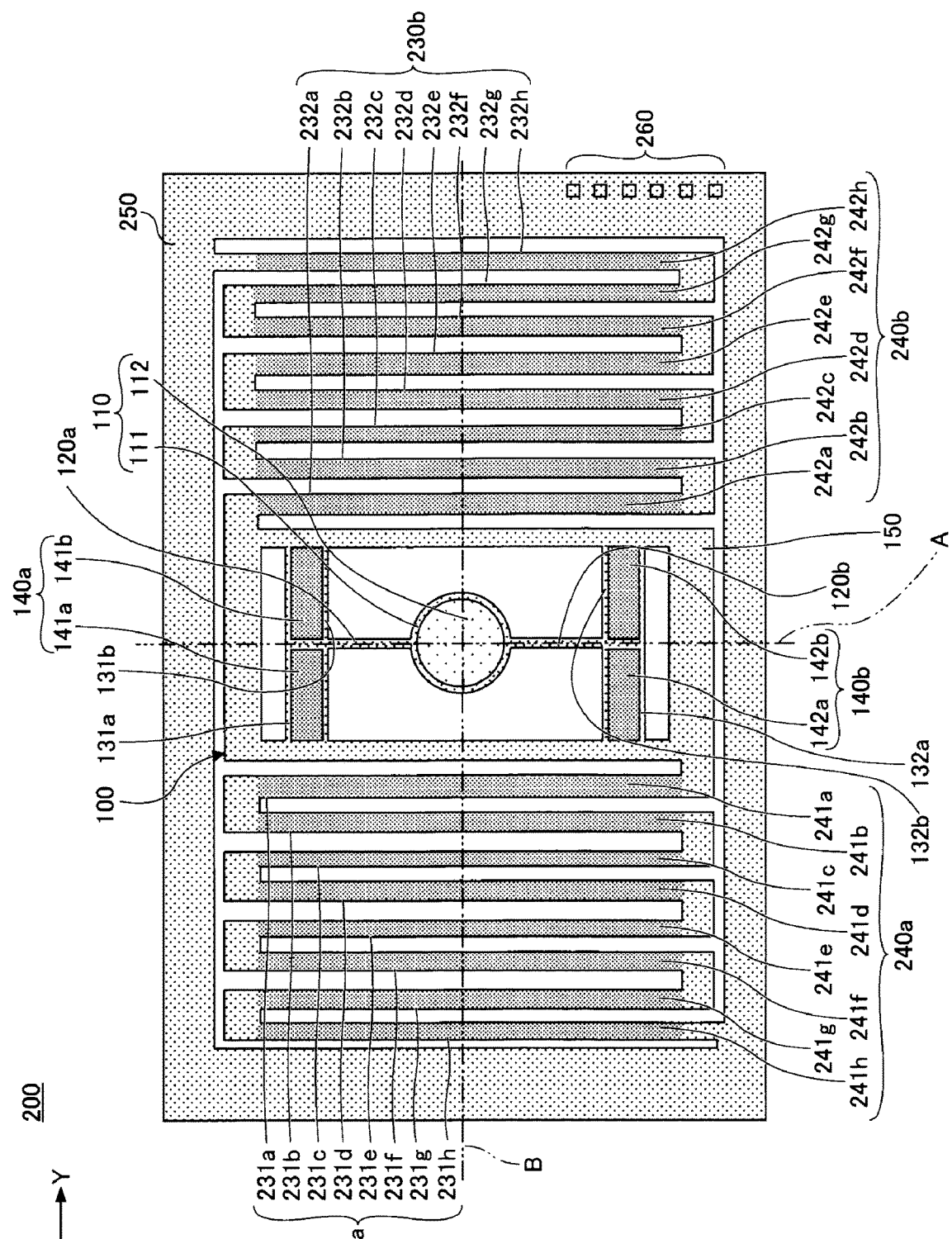
FIG. 29 is a plan view of a light deflector according to a fifth embodiment of the present disclosure.

FIG. 29 is a plan view of the light deflector 200 according to the fifth embodiment of the present disclosure. The light deflector 200 in FIG. 29 rotates a movable unit provided with a reflecting surface to deflect light incident on the reflecting surface biaxially (about the axis A and the axis B).

The light deflector 200 is configured to rotate the mirror unit 110 around both the axis A that corresponds to the main scanning direction and the axis B that corresponds to the sub-scanning direction. In other words, the light deflector 200 biaxially rotates the mirror unit 110 and biaxially deflects incident light while scanning. In the light deflector 200, the light deflector 100 is used in the main scanning direction (high speed axis). Hereinafter, the structure of the light deflector 200 is described in detail.

The light deflector 200 includes the light deflector 100, a pair of connecting parts 230a and 230b that connect the stationary part 150 and a stationary part 250 at an outer peripheral area of the stationary part 150, drive units 240a and 240b that deform the connecting parts 230a and 230b, the stationary part 250, and an electrode connecting part 260.

The drive units 140a and 140b causes the connecting parts 131a, 131b, 132a, and 132b to deform, and thereby cause the movable unit (the mirror unit 110 and the torsion beams 120a and 120b) to oscillate around the axis A that is orthogonal to the direction at which the connecting parts 131a, 131b, 132a, and 132b are bent. In addition, the drive units 240a and 240b deform the connecting parts 230a and 230b, and causes the movable unit to oscillate around the axis B that is orthogonal to the axis A.

The light deflector 200 includes, for example, one SOI substrate that is formed by any appropriate treatment method, such as etching. On the formed SOI substrate, the reflecting surface 112, the drive units 140a and 140b, the drive units 240a and 240b, and the electrode connecting part 260 are formed, which constitutes a single integrated structure. The above-described multiple elements may be formed after the SOI substrate is molded or may be formed while the SOI substrate is being molded.

The SOI substrate does not have to be planar, and may have, for example, a curvature. As long as the substrate is formed as a single integrated unit by etching or the like and is partially elastic, the member used for forming the light deflector 200 is not limited to the SOI substrate.

The connecting part 230a includes strip-shaped cantilevers 231a, 231b, 231c, 231d, 231e, 231f, 231g, and 231h whose longitudinal direction is orthogonal to the axis B (parallel to the X-direction). The cantilevers 231a, 231b, 231c, 231d, 231e, 231f, 231g, and 231h constitute a meandering structure in which the cantilevers 231a, 231b, 231c, 231d, 231e, 231f, 231g, and 231h are joined to turn. One end of the cantilever 231a is connected to the outer peripheral portion of the stationary part 150 of the light deflector 100, and one end of the cantilever 231h is connected to the inner peripheral portion of the stationary part 250.

Similarly, the connecting part 230b includes strip-shaped cantilevers 232a, 232b, 232c, 232d, 232e, 232f, 232g, and 232h whose longitudinal direction is orthogonal to the axis B (parallel to the X-direction).

The cantilevers 232a, 232b, 232c, 232d, 232e, 232f, 232g, and 232h constitute a meandering structure in which the cantilevers 232a, 232b, 232c, 232d, 232e, 232f, 232g, and 232h are joined to turn. One end of the cantilever 232a is connected to the outer peripheral portion of the stationary part 150 of the light deflector 100, and one end of the cantilever 232h is connected to the inner peripheral portion of the stationary part 250.

The connection portion at which the connecting part 230a is connected to the stationary part 150 of the light deflector 100 and the connection portion ar which the connecting part 230b is connected to the stationary part 150 of the light deflector 100 are symmetrical about the center of the reflecting surface 112, for example. The connection portion at which the connecting part 230a is connected to the stationary part 250 and the connection portion at which the connecting part 230b is connected to the stationary part 250 are symmetrical about the center of the reflecting surface 112, for example.

The drive unit 240a is formed on the front side of the connecting 230a, that is, on the side at which the reflecting surface 112 is formed, and has a unimorph structure. The drive unit 240b is formed on the front side of the connecting part 230b and has a unimorph structure.

The drive unit 240a has strip-shaped drive elements 241a, 241b, 241c, 241d, 241e, 241f, 241g, and 241h whose longitudinal direction is perpendicular to the axis B (the direction parallel to the X axis). The drive elements 241a to 241h are formed on the front side of the cantilevers 231a to 231h, respectively.

Similarly, the drive unit 240b has strip-shaped drive elements 242a, 242b, 242c, 242d, 242e, 242f, 242g, and 242h whose longitudinal direction is perpendicular to the axis B (the direction parallel to the X axis). The drive elements 242a to 242h are formed on the front side of the cantilevers 232a to 232h, respectively.

The drive elements 241a to 241h and 242a to 242h are piezoelectric elements, and each of the drive elements 241a to 241h and 242a to 242h includes a lower electrode, a piezoelectric circuit, and an upper electrode, which are sequentially formed in that order on the +Z-side surface of the silicon active layer serving as an elastic member. The lower electrode and the upper electrode are formed of, for example, gold (Au) or platinum (Pt). The piezoelectric circuit is formed of, for example, lead zirconate titanate (PZT) that is piezoelectric material.

The connecting parts 131a, 131b, 132a, and 132b are caused to oscillate by the inverse piezoelectric effects of the drive elements 141a, 141b, 142a, and 142b of the drive units 140a and 140b, and the oscillation of the connecting parts 131a, 131b, 132a, and 132b applies a twist to the torsion beams 120a and 120b. Twisting of the torsion beams 120a and 120b causes the mirror unit 110 to oscillate around the axis A.

Among the cantilevers 231a to 231h and 232a to 232h, odd-numbered cantilevers and even-numbered cantilevers, which are counted from the stationary part 250 side, are alternately arranged to be driven in opposite phases. Thus, the mirror unit 110 is caused to oscillate around the axis B. In other words, the oscillation of the mirror unit 110 enables light incident on the reflecting surface 112 to be deflected biaxially (i.e., around the axis A and the axis B).

The stationary part 250 is, for example, a rectangular supporting member formed to surround the stationary part 150. The stationary part 250 is formed of, for example, a silicon support layer, a silicon oxide layer, and a silicon active layer. The stationary part 250 does not have to be formed so as to completely surround the stationary part 150 of the light deflector 100, and an opening may be provided in the vertical direction (the Y-direction) in FIG. 29, for example.

The electrode connecting parts 260 are formed, for example, on the +Z-side surface of the stationary part 250. The electrode connecting parts 260 are electrically connected to, for example, the upper electrode and the lower electrode of each of the drive elements 141a, 141b, 142a, 142b, 241a to 241h, and 242a to 242h through electrode wiring made of, for example, aluminum (Al).

The electrode connecting parts 260 are electrically connected to, for example, a control device outside the light deflector 200. At least one of the upper electrode and the lower electrode may be directly connected to the electrode connecting part 260, or may be indirectly connected by connecting the electrodes to each other.

In the present embodiment, the drive unit 240a is formed on the front side of the connecting part 230a, and the drive unit 240b is formed on the front side of the connecting part 230b. Alternatively, the drive unit may be provided on the back side (the −Z-side surface) of the connecting part, or may be provided at both sides of the connecting part.

Each component may have any shape without limitation to the shapes according to the present embodiments, as long as the mirror unit 110 is rotatable about the axis A and the axis B. The torsion beams 120a and 120b, and the connecting parts 131a, 131b, 132a and 132b may have, for example, a shape with curvature.

In some other examples, an insulating layer formed of, for example, a silicon oxide layer may be formed at at least one of the +Z-side surface of the upper electrode of each of the drive units 240a and 240b and the +Z-side surface of the stationary part 250.

In this case, electrode wiring is provided on the insulating layer, and the insulating layer is partially removed as an opening or is not formed at a connection spot where the upper electrode or the lower electrode and the electrode wiring are connected. This configuration increases the degree of flexibility in design of the drive units 240a and 240b and the electrode wiring and also prevents short circuiting due to the electrodes contacting each other. The silicon oxide layer also serves as an anti-reflection member.

Thus, a light deflector 200 provided with the light deflector 100 according to the first embodiment is provided to achive biaxial oscillation of the minor uni. Instead of the light deflector 100, the light deflector 100A, 100B, 100C, or 100D to be described later may be used.

The light deflector 200 may adopt, for example, a raster scanning method to two-dimensionally scan with a light beam. In other words, the mirror unit 110 is caused to oscillate (perform scanning) around the axis A using a sine wave signal at a high speed (several kHz to several tens of kHz) corresponding to an excitation frequency of a resonance mode of the light deflector 100. The mirror unit 110 is also caused to oscillate (perform scanning) around the axis B using a drive signal having a sawtooth waveform at a lower speed (several Hz to 10 Hz). An image drawing apparatus that uses a light beam scanning, for example, draws an image by blinking a light beam in accordance with the scanning angle of the mirror unit 110.

The following describes a light deflector 100D of a cantilever structure according to a sixth embodiment. In the following description, the same components as those in the first embodiment are not described.

Figure 30:
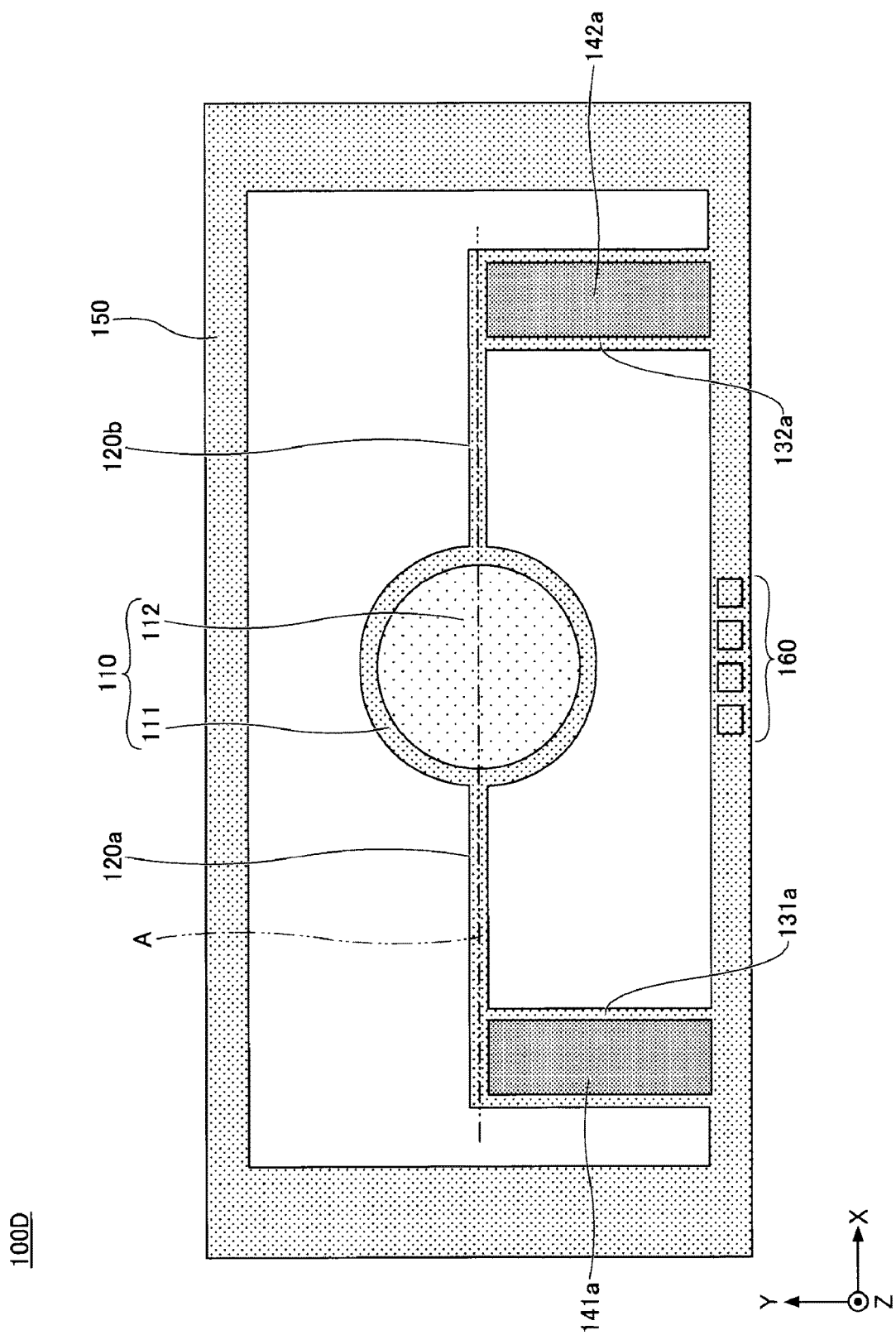
FIG. 30 is a plan view of a light deflector according to a sixth embodiment of the present disclosure.

FIG. 30 is a plan view of a light deflector 100D according to the sixth embodiment of the present disclosure as viewed from the front surface (i.e., the reflecting surface 112).

The light deflector 100D as illustrated in FIG. 30 has a cantilever structure that rotates a movable unit having a reflecting surface to deflect light incident on the reflecting surface uniaxially (around an axis A parallel to the X-axis).

Unlike the light deflector 100, the light deflector 100D has a cantilever structure and does not have the connecting parts 131b and 132b and the drive elements 141b and 142b.

In the light deflector 100D, the mirror unit 110 is supported by the stationary part 150 via the torsion beams 120a and 120b and the connecting parts 131a and 132a such that the mirror unit 110 is rotatable around the axis A. The connecting parts 131a and 132a are caused to oscillate by the inverse piezoelectric effects of the drive elements 141a and 142a, and the oscillation of the connecting parts 131a and 132a applies a twist to the torsion beams 120a and 120b. Twisting of the torsion beams 120a and 120b causes the mirror unit 110 to oscillate.

Thus, in the light deflector 100D, the mirror unit 110 is rotatable around the axis A, same as in the light deflector 100. In other words, the light deflector 100D uniaxially rotates the mirror unit 110 and uniaxially deflect incident light while scanning.

Without any measures taken in the light deflector 100D of a cantilever structure as well, applying voltage to each drive element might change the direction in which the torsion beams 120a and 120b are bent in addition to the direction in which the torsion beams 120a and 120b are twisted.

The rib 170 as illustrated in FIGS. 14 and 15 is formed at the back side of each of the connecting parts 131a and 132a in the light deflector 100D in the same manner as in the light deflector 100, so as to handle such a situation. This prevents the torsion beams 120a and 120b from being deformed in the X-direction and enables only the component in the direction at which the torsion beams 120a and 120b are twisted to be obtained. This configuration enables the mirror unit 110 to effectively oscillate in accordance with the voltage applied to each of the drive elements 141a, 141b, 142a, and 142b, and thus increases an angle of oscillation of the mirror unit 110 per unit voltage, that is, an angle, at which the mirror unit 110 oscillates, per unit voltage.

Note that the light deflector 100D may include the rib 170A, 170B, or the rib 170C instead of the rib 170. This configuration enables the mirror unit 110 to effectively oscillate in accordance with the voltage applied to each of the drive elements 141a, 141b, 142a, and 142b, and thus increases an angle of oscillation of the mirror unit 110 per unit voltage, that is, an angle, at which the mirror unit 110 oscillates, per unit voltage.

Although the preferred embodiments have been described in detail above, the present disclosure is not limited to the above-described embodiments, and various modifications and substitutions may be made to the above-described embodiments without departing from the scope described in the claims.

In the embodiments described above, a piezoelectric drive method in which the piezoelectric element is used to oscillate the movable unit is employed. However, no limitation is intended thereby, and an electrostatic drive method that employs electrostatic force to drive the movable unit, or an electromagnetic drive method that employs electromagnetic force to drive the movable unit may be used.

In the fifth embodiment, the same drive method is applied to oscillate the movable unit in the main scanning direction and in the sub-scanning direction. Alternatively, different drive methods may be employed to oscillate the movable unit in the main-scanning direction and the sub-scanning direction, respectively.

Numerous additional modifications and variations are possible in light of the above teachings. It is therefore to be understood that, within the scope of the above teachings, the present disclosure may be practiced otherwise than as specifically described herein. With some embodiments having thus been described, it will be obvious that the same may be varied in many ways. Such variations are not to be regarded as a departure from the scope of the present disclosure and appended claims, and all such modifications are intended to be included within the scope of the present disclosure and appended claims.

The invention claimed is:

1. A light deflector comprising:
   a stationary part;
   a movable structure having a reflecting surface;
   a connecting part between the movable structure and the stationary part;
   a drive structure disposed on a first surface of the connecting part to deform the connecting part to oscillate the movable structure; and
   a rib disposed on a second surface of the connecting part, the second surface being an opposite surface of the first surface,
   the rib including a portion whose longitudinal direction is orthogonal to a direction at which the connecting part is bent,
   wherein the rib and the drive structure overlap with each other as viewed from a direction normal to the second surface.

2. The light deflector according to claim 1,
   wherein one end of the connecting part is connected to the stationary part, and the other end of the connecting part is connected to the movable structure, and
   when a first direction denotes a direction from the one end to the other end of the connecting part in a plane of the connecting part, and a second direction is orthogonal to the first direction in the plane, the portion is disposed with the longitudinal direction parallel to the second direction.

3. The light deflector according to claim 2,
   wherein the connecting part is comprised of at least one material selected from the group consisting of Si, $Al_2O_3$, SiC, and SiGe.

4. The light deflector according to claim 1,
   wherein the light deflector has a structure in which a silicon support layer, a silicon oxide layer, and a silicon active layer are sequentially stacked,
   wherein the connecting part includes the silicon active layer, and
   the rib includes a layered structure of the silicon support layer and the silicon oxide layer and is connected to the connecting part with the silicon oxide layer between the rib and the connecting part.

5. The light deflector according to claim 1,
   wherein the rib further includes another portion whose longitudinal direction is parallel to the direction at which the connecting part is bent, and
   the portion and said another portion are in contact with each other.

6. The light deflector according to claim 5,
   wherein the rib has a shape closed by the portion and said another portion as viewed from the direction normal to the second surface.

7. The light deflector according to claim 1,
   wherein the rib has a round edge.

8. An optical scanning system comprising the light deflector according to claim 1.

9. An image forming apparatus comprising the optical scanning system according to claim 8.

10. An image projection device comprising the light deflector according to claim 1.

11. A light detection and ranging device comprising the light deflector according to claim 1.

12. A light deflector comprising,
    a first stationary part;
    a movable structure having a reflecting surface;
    a first connecting part between the movable structure and the first stationary part;
    a first drive structure disposed on a first surface of the first connecting part to deform the first connecting part to oscillate the movable structure about a first axis;
    a rib disposed on a second surface of the first connecting part, the second surface being an opposite surface of the first surface, the rib including a portion whose longitudinal direction is orthogonal to a direction at which the first connecting part is bent, the first axis being orthogonal to the direction at which the first connecting part is bent;
    a second stationary part disposed at an outer peripheral area of the first stationary part;
    a pair of second connecting parts each connected to the first stationary part and the second stationary part; and
    second drive structures each to deform a corresponding one of the second connecting parts to oscillate the movable structure about a second axis orthogonal to the first axis,
    wherein the first drive structure and the rib overlap with each other as viewed from a direction normal to the second surface.

13. An optical scanning system comprising the light deflector according to claim 12.

14. An image forming apparatus comprising the optical scanning system according to claim 13.

15. An image projection device comprising the light deflector according to claim 12.

16. A light detection and ranging device comprising the light deflector according to claim 12.

17. The light deflector according to claim 1,
wherein the rib includes multiple ribs,
in each of the first surface and the second surface of the connecting part, a direction from one end to the other end of the connecting part is a first direction, and a direction orthogonal to the first direction is a second direction,
the multiple ribs are placed at intervals in the second direction, and
each of the intervals is smaller than a distance between the one end and a rib closest to the one end among the multiple ribs.

18. The light deflector according to claim 1,
wherein the rib includes multiple ribs,
in each of the first surface and the second surface of the connecting part, a direction from one end to the other end of the connecting part is a first direction, and a direction orthogonal to the first direction is a second direction,
the multiple ribs are placed at intervals in the second direction, and
each of the intervals is smaller than a distance between the other end of the connecting part and a rib closest to the other end among the multiple ribs.

* * * * *